United States Patent [19]
Matsumoto et al.

[11] Patent Number: 6,076,484
[45] Date of Patent: Jun. 20, 2000

[54] APPARATUS AND METHOD FOR MICROWAVE PLASMA PROCESS

[75] Inventors: Naoki Matsumoto; Toshio Nakanishi, both of Amagasaki, Japan

[73] Assignee: Sumitomo Metal Industries, Limited, Osaka, Japan

[21] Appl. No.: 09/170,747

[22] Filed: Oct. 13, 1998

[30] Foreign Application Priority Data

Oct. 20, 1997 [JP] Japan .................................. 9-287472
Jan. 12, 1998 [JP] Japan ................................ 10-004336
Jul. 23, 1998 [JP] Japan ................................ 10-208225

[51] Int. Cl.⁷ .................................................. C23C 16/00
[52] U.S. Cl. ........................ 118/723 MW; 118/723 MR; 118/723 R; 118/723 MA; 204/298.38; 204/298.37
[58] Field of Search ..................... 118/50.1, 623, 118/665, 712, 715, 719, 723 AN, 723 ER, 723 IR, 723 MA, 723 ME, 723 MP, 723 MR, 723 MW; 156/345; 204/298.38; 313/231.31; 315/111.41

[56] References Cited

U.S. PATENT DOCUMENTS 5,359,177  10/1994  Taki et al. ........................... 219/121.43

FOREIGN PATENT DOCUMENTS 5-43097  10/1993  Japan .............................. C23C 16/50

*Primary Examiner*—Thi Dang
*Assistant Examiner*—Rudy Zervigon
*Attorney, Agent, or Firm*—Barnes & Thornburg

[57] ABSTRACT

The invention provides a microwave plasma process apparatus in which an antenna having a tubular member curved in a C shape or a spiral shape and including a slit is disposed on a sealing member for sealing a chamber, so that a microwave can be emitted through the slit to the sealing member.

27 Claims, 23 Drawing Sheets

APPARATUS AND METHOD FOR MICROWAVE PLASMA PROCESS

BACKGROUND OF THE INVENTION

The present invention relates to an apparatus and method for conducting a process such as etching, ashing and depositing on a semiconductor substrate or an LCD glass plate by utilizing plasma generated by using microwaves.

Plasma generated by externally applying an energy to a reaction gas is widely used in manufacture processes for LSIs and LCDs. In particular, the usage of plasma is an indispensable basic technique in a dry etching process.

FIG. 1 is a side sectional view of a conventional microwave plasma process apparatus and FIG. 2 is a plan view of the plasma process apparatus of FIG. 1. A reactor 31 in the shape of a rectangular box is made from aluminum. The reactor 31 is provided with a microwave introducing window at its upper portion, and the microwave introducing window is airtightly sealed with a sealing plate 34. The sealing plate 34 is made from a dielectric material, such as quartz glass and alumina, having heat resistance, microwave penetrability and a small dielectric loss.

The reactor 31 is coupled with a covering 40 in the shape of a rectangular box covering the upper portion of the reactor 31. A dielectric plate 41 is disposed on the ceiling within the covering 40, and an air gap 43 is provided between the dielectric plate 41 and the sealing plate 41. The dielectric plate 41 is formed out of a plate of a dielectric material, for example, a fluororesin such as Teflon (registered trademark), a polyethylene resin or a polystyrene resin in a substantially pentagonal shape, obtained by combining a rectangle and a triangle, provided with a projection on its apex. The projection on the apex of the dielectric plate 41 is fit in a waveguide 21 coupled with the covering 40. The waveguide 21 is connected with a microwave oscillator 20, so that a microwave oscillated by the microwave oscillator 20 can be guided by the waveguide 21 so as to enter the projection of the dielectric plate 41.

As described above, the base portion of the projection of the dielectric plate 41 is formed as a taper portion 41a in a substantially triangle shape in a plan view. The microwave having entered the projection is expanded in the lateral direction along the taper portion 41a and propagated in the entire dielectric plate 41. The microwave is reflected on the end face of the covering 40 opposing the waveguide 21, so that the incident wave and the reflected wave can be superimposed so as to generate a standing wave in the dielectric plate 41.

The inside of the reactor 31 works as a process chamber 32, and a desired gas is introduced into the process chamber 32 through a gas inlet tube 35. At the center of the bottom of the process chamber 32, a table 33 for placing a sample W is disposed, and the table 33 is connected through a matching box 36 with an RF power supply 37 for supplying power of several hundred KHz through several tens MHz. The bottom of the reactor 31 is also provided with an air outlet 38, so as to exhaust the air within the process chamber 32 through the air outlet 38.

In conducting an etching process on the surface of the sample W by using this microwave plasma process apparatus, the pressure within the process chamber 32 is decreased down to a desired pressure by exhausting through the air outlet 38, and then, a reaction gas is supplied to the process chamber 32 through the gas inlet tube 35. Subsequently, a microwave is oscillated by the microwave oscillator 20, and the oscillated microwave is introduced into the dielectric plate 41 through the waveguide 21. At this point, the microwave is uniformly expanded within the dielectric plate 41 owing to the taper portion 41a, thereby generating a standing wave in the dielectric plate 41. This standing wave forms a leakage electric field below the dielectric plate 41, and the leakage electric field is introduced into the process chamber 32 through the air gap 43 and the sealing plate 34. In this manner, the microwave is propagated to the process chamber 32. As a result, plasma is generated in the process chamber 32, and the surface of the sample W is etched by using the plasma.

The conventional microwave plasma process apparatus includes the taper portion 41a projecting from the edges of the sealing plate 34 and the reactor 31 in the horizontal direction in order to uniformly expand the microwave in the dielectric plate 41. The dimension of the taper portion 41a is defined in accordance with the area of the dielectric plate 41, namely, the dimension of the process chamber 32. Accordingly, when the conventional microwave plasma process apparatus is to be installed, an additional horizontally extending space is required for the taper portion 41a projecting from the edge of the reactor 31. In accordance with the dimensional increase of the sample W, there is a demand for a microwave plasma process apparatus including the reactor 31 with a further larger dimension. Also, there is a demand that the entire apparatus can be installed in a space as small as possible. However, since the dimension of the taper portion 41a of the conventional apparatus is defined in accordance with the dimension of the reactor 31, these demands cannot be satisfied at the same time.

BRIEF SUMMARY OF THE INVENTION

The present invention was devised to overcome the aforementioned conventional problems, and one object of the invention is providing a microwave plasma process apparatus whose size can he suppressed to be installed in a small space even when the size of a reactor is large.

Another object of the invention is providing a microwave plasma process apparatus in which the uniformly process can be executed even when a distance between an antenna and a sample is small.

Still another object of the invention is providing a microwave plasma process apparatus in which the process speed can be improved.

Still another object of the invention is providing a microwave plasma process apparatus in which a usage efficiency of a reaction gas can be improved.

The microwave plasma process apparatus of this invention comprises a chamber being sealed with a sealing member; a gas inlet tube for introducing a gas into the chamber; and an antenna disposed opposing a surface of the sealing member, wherein the antenna includes a tubular member having, at one end thereof, an entrance through which a microwave enters and a closing member for closing the other end thereof; and a slit formed in a portion of the tubular member opposing the sealing member.

Alternatively, in the microwave plasma process method of this invention, the aforementioned apparatus is used for generating plasma by introducing a microwave into the antenna and introducing a gas into the chamber through the gas inlet tube, so that a target can be treated with the plasma.

According to the invention, a microwave enters the antenna disposed on the surface of the sealing member for sealing the opening of the chamber. The microwave is propagated through the tubular member of the antenna and reflected by the closing member for closing one end of the tubular member, and the incident wave is superimposed on the reflected wave, thereby generating a standing wave. This standing wave allows a current having a maximum value at predetermined intervals to flow in the wall of the tubular member. The tubular member is provided with a slit in a portion opposing the sealing member, and a potential difference is caused by the current between the inside and the outside of the tubular member with the slit interposed therebetween. This potential difference allows an electric field to be emitted from the slit to the sealing member. In other words, the microwave is thus propagated from the antenna to the sealing member. The microwave is introduced into the chamber through the sealing member, so as to generate plasma in the chamber.

In this manner, the microwave can directly enter the tubular member of the antenna, and hence, the antenna does not project from the chamber. Accordingly, the horizontal dimension of the microwave plasma process apparatus can be made as small as possible. On the other hand, since the microwave is introduced to an appropriate position above the chamber by the tubular member of the antenna and emitted through the slit, the microwave can be uniformly introduced into the chamber. Moreover, when the tubular member has a predetermined inner diameter, it is possible to generate a standing wave in a single mode (basic mode) in the antenna, so that an energy loss can be as small as possible.

In one aspect of the microwave plasma process apparatus, the tubular member is curved, disposing substantially parallel to the surface of the sealing member.

Furthermore, in the microwave plasma process apparatus, the tubular member is in a C shape or a spiral shape.

In the tubular member curved with its axis direction retained substantially parallel to the surface of the sea ting member in, for example, a C shape or a spiral shape, the microwave can be introduced into the entire chamber. Thus, the microwave can be uniformly introduced into the chamber.

In another aspect of the microwave plasma process apparatus, the slit is plural in number each of which is away from the closing member by a predetermined distance 1.

The microwave introduced to an appropriate position above the chamber by the tubular member of the antenna is emitted to the sealing member through the plural slits formed at appropriate intervals. Therefore, the microwave can be uniformly introduced into the chamber.

In still another aspect of the microwave plasma process apparatus, the predetermined distance L is defined on the basis of the following formula:

L=$\lambda$g/2, wherein $\lambda$g indicates a wavelength of a microwave propagated through the antenna.

The current flowing in the wall of the tubular member caused by the standing wave generated in the tubular member of the antenna has a maximum value in positions away from the closing member by the distances L=$\lambda$g/2. Therefore, by forming the slits in these positions, the microwave can be emitted from the slits with the energy loss suppressed as far as possible.

In still another aspect of the microwave plasma process apparatus, the slit is formed with a longitudinal direction thereof aligned along a direction crossing a center axis of the tubular member.

Alternatively, the slit is formed with a longitudinal direction thereof aligned substantially parallel to a center axis of the tubular member.

Accordingly, even when the wavelength of the microwave propagated through the antenna is changed by the generated plasma, the positions corresponding to the maximum value of the current can be covered by the slits.

In one aspect of the microwave plasma process apparatus, dielectric is fit in the slit.

The wavelength of the microwave having entered the antenna is decreased by $1/\sqrt{\in r}$ (wherein $\in r$ indicates a dielectric constant of the dielectric). Therefore, in tubular members having the same lengths, the number of positions corresponding to the maximum value of the current flowing in the wall of the tubular member is larger in one containing the dielectric than in one not containing the dielectric. Therefore, the number of the slits to be formed can be increased. As a result, the microwave can be further uniformly introduced into the chamber.

In another aspect of the microwave plasma process apparatus, a dielectric is fit in the tubular member.

Accordingly, abnormal discharge can be avoided, and the plasma process can be stably and uniformly conducted.

In still another aspect of the microwave plasma process apparatus, the closing member is fit in the tubular member movably in a longitudinal direction of the tubular member.

Alternatively, in the microwave plasma process method of the invention, the aforementioned apparatus is used so that the closing member can be moved in the longitudinal direction of the tubular member in accordance with a density of the generated plasma.

For example, in the case where a distance between the chamber for generating the plasma and the antenna is small, when the density of the plasma generated in the chamber is increased, the wavelength of the microwave propagated through the antenna is shortened owing to coupling between the antenna and the plasma. As a result, the positions corresponding to the maximum value of the current flowing in the wall of the tubular member are changed. At this point, the position of the closing member provided on the tubular member movably along the longitudinal direction of the tubular member is adjusted, so that the positions corresponding to the maximum value of the current can accord with the positions of the slits. In this manner, even when the distance between the chamber for generating the plasma and the antenna is small, the microwave can be highly efficiently emitted from the antenna.

In one aspect, the microwave plasma process apparatus further comprises a supporting member for supporting the antenna; and a driver for moving bi-directionally the supporting member so as to adjust a distance between the antenna and the sealing member.

Alternatively, in the microwave plasma process method of the invention, the aforementioned apparatus is used, so that the supporting member can be moved forward or backward in accordance with the density of the generated plasma.

In accordance with the density increase of the plasma generated in the chamber, the supporting member is moved backward by the driver, so that the distance between the antenna and the sealing member can be increased. In this manner, the coupling between the antenna and the plasma is weakened, and the plasma can be prevented from affecting the microwave propagated through the antenna.

The microwave plasma process apparatus of this invention comprises a chamber being sealed with a sealing member; a gas inlet tube for introducing a gas into the chamber; and an antenna disposed opposing a surface of the sealing member, wherein the antenna includes a tubular member having, at one end thereof, an entrance through which a microwave enters and a closing member for closing the other end thereof; and a slit formed in a portion of the tubular member opposing the sealing member, and the microwave plasma process apparatus further comprises an electrode disposed in an area on the sealing member surrounded with a curve portion of the antenna and electrically insulated from the antenna.

In another aspect, the microwave plasma process apparatus further comprises a high frequency AC power supply for applying an electric field to the electrode.

According to this invention, a high frequency electric field of approximately 13.56 MHz is applied to the electrode disposed in the area surrounded with the curve portion of the antenna and electrically insulated from the antenna, thereby generating plasma in an area opposing the electrode within the chamber. Since the plasma is generated in and around the area opposing the electrode within the chamber in this manner, the plasma can be sufficiently diffused to be substantially uniform on the same plane as the target even when the distance between the antenna and the target is small. Accordingly, the vertical dimension of the microwave plasma process apparatus can be made more smaller, and a desired plasma process can be conducted at a high speed.

In another aspect, the microwave plasma process apparatus further comprises a low frequency AC power supply for applying an electric field to the electrode.

According to this invention, a low frequency electric field of 200 KHz to 2 MHz, and preferably, of 400 MHz is applied to the electrode. When the electric field is negative, positively charged ions included in the plasma are moved toward the center of the curve portion of the antenna, and when the electric field is positive, the ions are moved in the reverse direction. As a result, the diffusion efficiency of the plasma can be improved with the state of the plasma stably retained. Therefore, even when the distance between the antenna and the target is small, the plasma can be generated in substantially a uniform density on the same plane as the target. As a result, the vertical dimension of the microwave plasma process apparatus can be made more smaller, and a desired plasma process can be conducted at a high speed.

In general, in anisotropic etching having directivity in direction along the thickness of a target, ions included in plasma are introduced onto the target by applying a low frequency bias ($V_a\sin(\omega t)$, wherein 107 indicates an angular frequency and t indicates time) to a table for placing the target within a chamber. Accordingly, when a bias ($-V_b\sin(\omega t)$) reverse to the low frequency bias applied to the table is applied to the electrode, the ions included in the plasma receive a potential of ($V_a+V_b$) at the center of the table, resulting in improving the anisotropy in the etching process.

In still another aspect, the microwave plasma process apparatus further comprises a DC power supply for applying an electric field to the electrode.

Accordingly, positively charged ions included in the plasma are moved toward the center of the curve portion of the antenna, resulting in uniformly dispersing the plasma. Therefore, the distance between the antenna and the target can be decreased, and hence, the vertical dimension of the microwave plasma process apparatus can be made small, and the target can be treated with the plasma at a high speed.

In still another aspect, the microwave plasma process apparatus further comprises a waveguide connected with an area on the sealing member surrounded with a curve portion of the antenna; and a microwave oscillator for oscillating a microwave into the waveguide.

The microwave is introduced into the chamber from the waveguide connected with the area surrounded with the curve portion of the antenna for generating the plasma. Therefore, the plasma is generated in and around an area opposing the opening of the waveguide within the chamber. Thus, the plasma can be sufficiently diffused so as to be substantially uniform on the same plane as the target even when the distance between the antenna and the target is small. As a result, a desired plasma process can be conducted at a high speed.

Furthermore, since the plasma can be generated by introducing the microwave from the waveguide into the chamber separately from the plasma generated by using the microwave emitted from the antenna, the plasma process speed at the center and at the edge of the target can be made uniform by controlling the power of the microwave introduced into the waveguide without adjusting the poser of the microwave emitted from the antenna.

The microwave plasma process apparatus of this invention for treating a target with plasma generated by using an introduced microwave comprises a chamber one side of which is sealed with a sealing member; a gas inlet tube for introducing a gas into the chamber; and an antenna disposed opposing a surface of the sealing member, wherein the antenna includes a tubular member having, at one end thereof, an entrance through which a microwave enters and a closing member for closing the other end thereof; and a slit formed in a portion of the tubular member opposing the sealing member, and the microwave plasma process apparatus further comprises a gas inlet for introducing the gas having passed through the gas inlet tube into the chamber, disposed on a face of the sealing member facing the chamber and in a portion opposing an area surrounded with a curve portion of the antenna.

Since the gas is introduced into the chamber through the gas inlet disposed in the portion of the sealing member opposing the area surrounded with the curve portion of the antenna, the gas is radially diffused from the center of the chamber along the center axis of the chamber and toward the entire periphery. As a result, the plasma is generated in substantially a uniform density in the horizontal direction of the chamber. Therefore, the entire area of the target can be treated at a uniform speed.

In addition, since most of the gas is supplied to the plasma generated in the chamber and the supplied gas remains in the plasma for a comparatively long period of time, the usage efficiency of the gas can be improved.

In one aspect, the microwave plasma process apparatus further comprises an electrode disposed in the area on the sealing member surrounded with the curve portion of the antenna and electrically insulated from the antenna, wherein the gas inlet tube penetrates the electrode and the sealing member.

In another aspect, the microwave plasma process apparatus further comprises an electrode disposed in the area on the sealing member surrounded with the curve portion of the antenna and electrically insulated from the antenna, wherein the gas inlet tube penetrates a part of the sealing member opposing a gap between the electrode and an inner circumference of the curve portion of the antenna.

Accordingly, the gas is introduced into the chamber from the center thereof and the usage efficiency of the gas can be improved. In addition, the plasma can he generated in substantially a uniform density in the horizontal direction of the chamber. On the other hand, since the gas inlet tube is disposed in the portion opposing the curve portion of the antenna, the gas inlet tube does not harmfully affect the microwave propagated through the antenna.

When a high frequency electric field of, for example, approximately 13.56 MHz is applied to the electrode, plasma can be generated in an area opposing the electrode within the chamber. Accordingly, the dimension of the microwave plasma process apparatus, in particular, the vertical dimension thereof can be made small, and a desired plasma process can be conducted at a high speed.

In still another aspect, the microwave plasma process apparatus further comprises a waveguide connected with the area on the sealing member surrounded with the curve portion of the antenna; and a microwave oscillator for oscillating a microwave into the waveguide, wherein the gas inlet tube penetrates a part of the sealing member opposing a gap between the waveguide and an inner circumference of the curve portion of the antenna.

The plasma is generated in and around an area opposing the opening of the waveguide within the chamber, and hence, the plasma can be sufficiently diffused to be substantially uniform on the same plane as the target even when the distance between the antenna and the target is small. Therefore, the dimension of the microwave plasma process apparatus, in particular, the vertical dimension thereof can be made small, and a desired plasma process can be conducted at a high speed.

Moreover, the plasma can be generated by introducing the microwave into the chamber from the waveguide separately from the plasma generated by using the microwave emitted from the antenna. Therefore, the plasma process speed at the center and at the edge of the target can be made uniform by controlling the power of the microwave introduced into the waveguide without adjusting the power of the microwave emitted from the antenna.

The above and further objects and features of the invention will more fully be apparent from the following detailed description with accompanying drawings.

DETAILED DESCRIPTION OF THE INVENTION

Preferred embodiments of the invention will now be described with reference to the accompanying drawings.

Embodiment 1

Figure 3:
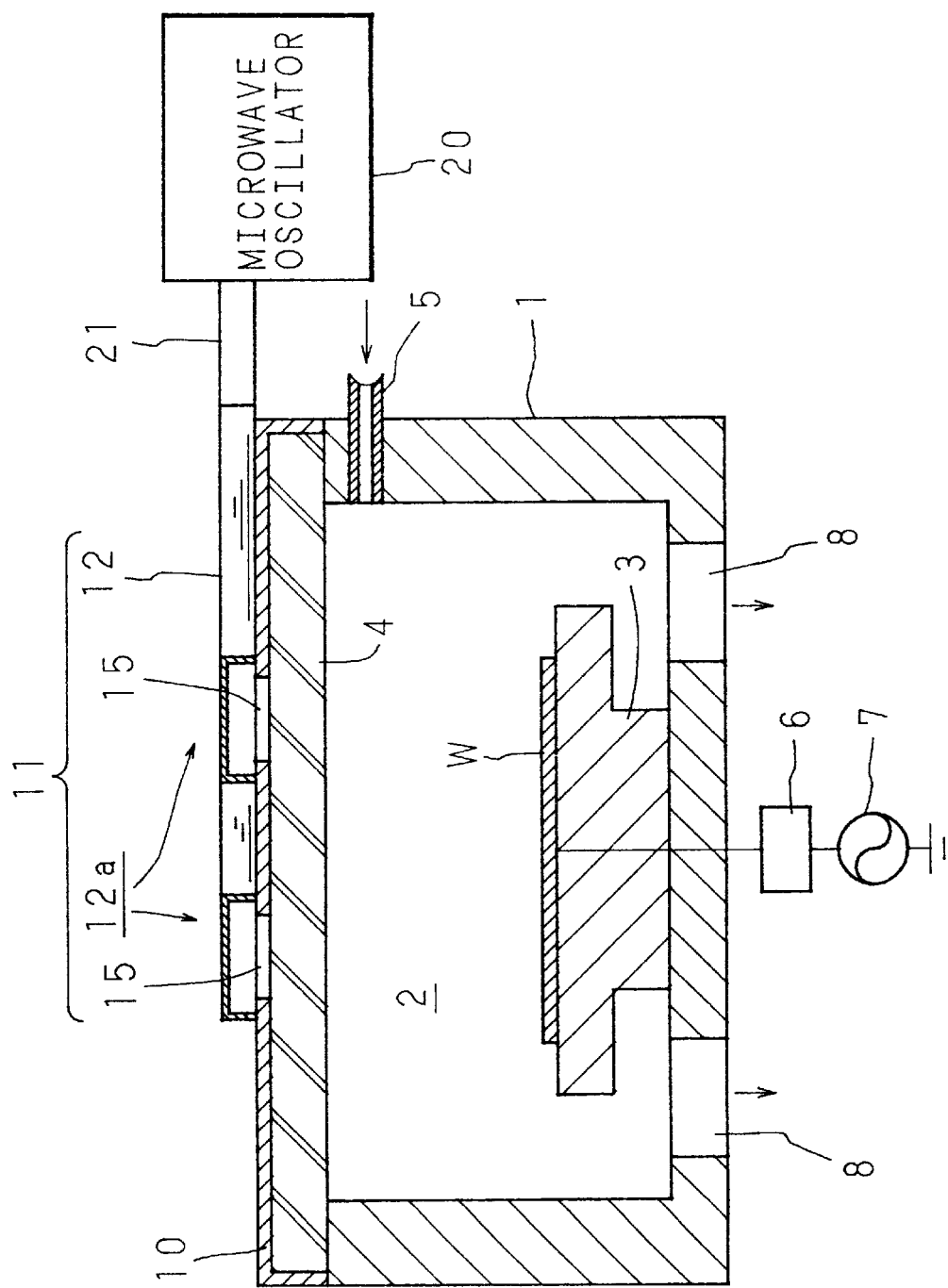
FIG. 3 is a side sectional view for showing the structure of a microwave plasma process apparatus according to a first embodiment of the invention.
Figure 4:
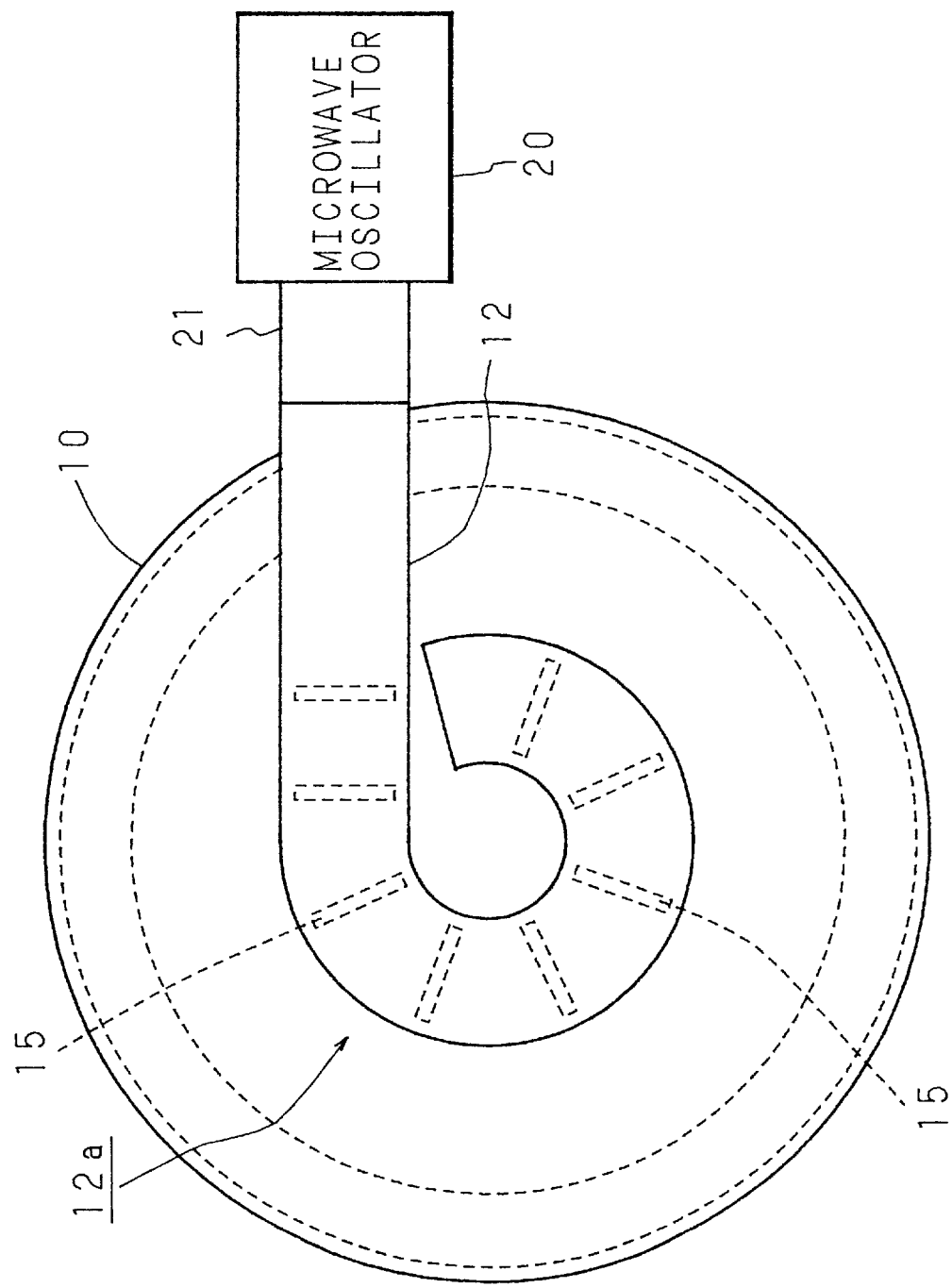
FIG. 4 is a plan view of the microwave plasma process apparatus of FIG. 3.

FIG. 3 is a side sectional view for showing the structure of a microwave plasma process apparatus according to a first embodiment of the invention, and FIG. 4 is a plan view of the microwave plasma process apparatus of FIG. 3. A reactor 1 in the shape of a bottomed cylinder is made from aluminum. The reactor 1 is provided with a microwave introducing window in its upper portion, and the microwave introducing window is airtightly sealed with a sealing plate 4. The sealing plate 4 is made from a dielectric material, such as quartz glass and alumina, having heat resistance, microwave penetrability and a small dielectric loss.

The upper face and outer circumference of the sealing plate is covered with a covering 10 of a conductive metal in the shape of a circular cap, and the covering 10 is fixed on the reactor 1. An antenna 11 is disposed on the upper face of the covering 10 for introducing a microwave into the reactor 1. The antenna 11 is fixed on the upper face of the covering 10, and includes a waveguide antenna part 12 and plural slits 15 disposed in portions of the covering 10 opposing the waveguide antenna part 12.

One end of the waveguide antenna part 12 is coupled with a waveguide 21 connected with a microwave oscillator 20, and the other end of the waveguide antenna part 12 is closed. The former end of the waveguide antenna part 12 is straight and the latter end forms a curve portion 12a having an appropriate curvature in an ark shape (C shape) or in the shape of one spire (in the ark shape in FIG. 3). The waveguide antenna part 12 is fixed on the upper face of the covering 10 in a manner that the center of the curve portion 12a accords with the center of the covering 10.

A microwave oscillated by the microwave oscillator 20 enters the waveguide antenna part 12 of the antenna 11 through the waveguide 21. This incident wave is superimposed on a reflected wave from the closed end of the waveguide antenna part 12, thereby generating a standing wave in the waveguide antenna part 12. As a result, a current having a maximum current value at intervals of n·λg/2 (wherein n is an integer larger than 0 or equal 0 and λg indicates a wavelength of the microwave propagated through the antenna) from the closed end of the waveguide antenna part 12 is allowed to flow in the peripheral wall of the waveguide antenna part 12.

At this point, the dimension of the waveguide antenna part 12 is defined as a height of 27 mm and a width of 96 mm in accordance with the frequency of the microwave, that is, 2.45 GHz, so that a mode of the microwave propagated through the waveguide antenna part 12 can be placed in the rectangular TE10 mode, that is, a basic propagation mode. A microwave in this mode can be propagated through the waveguide antenna part 12 with scarcely losing its energy. Also, when the sealing plate I has a diameter of 380 mm, a distance from the center of the curve portion 12a to the center in the lateral direction of the waveguide antenna part 12 is approximately 120 mm.

Figure 5:
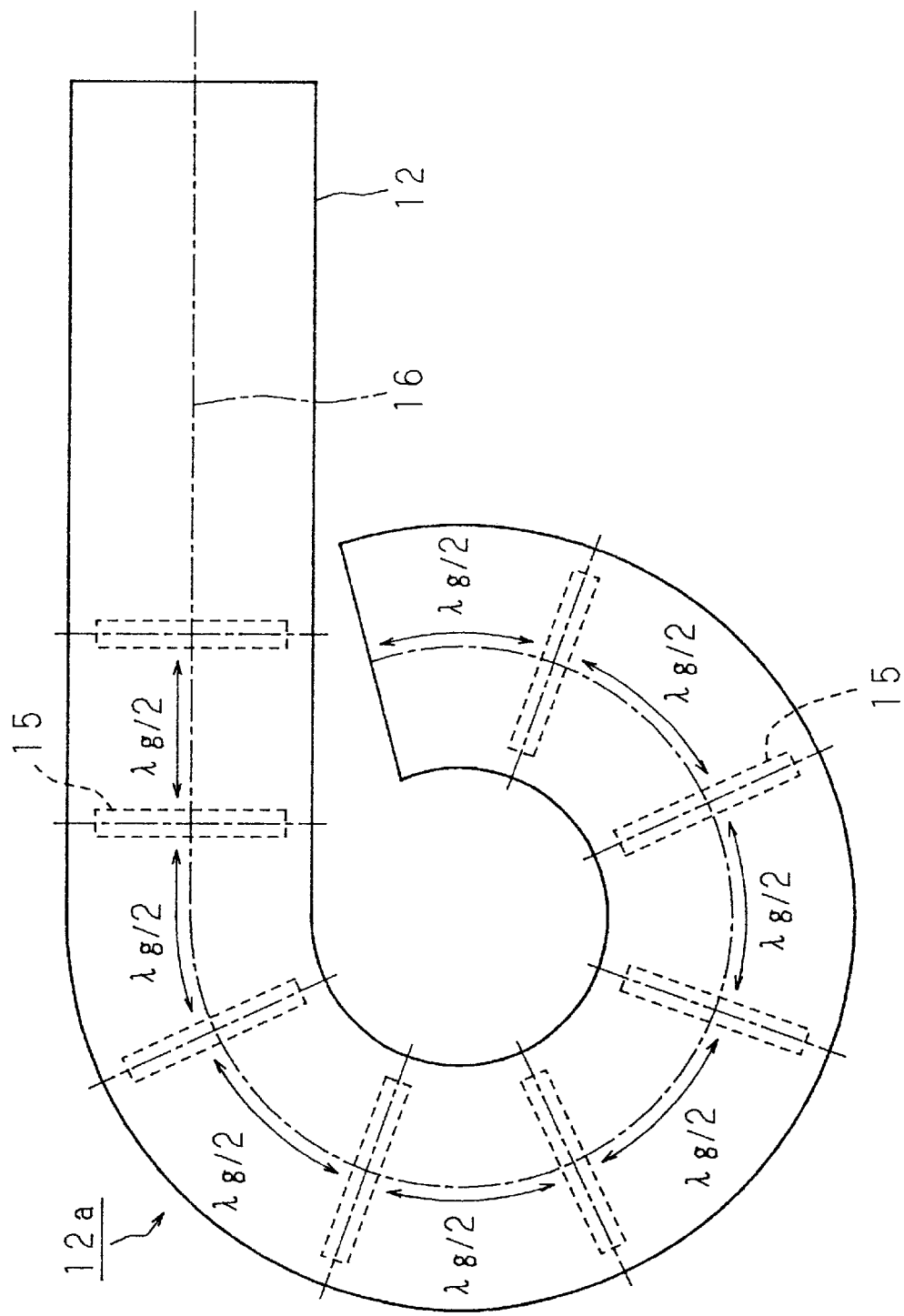
FIG. 5 is an explanatory diagram for illustrating a structure of slits shown in FIGS. 3 and 4.

FIG. 5 is an explanatory diagram for illustrating the slits 15 shown in FIGS. 3 and 4. As is shown in FIG. 5, each of the slits 15, is formed in a portion of the covering 10 (shown in FIG. 4) opposing the curve portion 12a so as to he perpendicular to a center axis 16 of the curve portion 12a. The position of each slit 15 is determined to be away from the closed end of the waveguide antenna part 12 by a distance of n·λg/2. In this manner, the slits 15 are disposed in positions where the current flowing in the peripheral wall of the waveguide antenna part 12 has the maximum value, and hence, an electric field is emitted by each slit 15 owing to a potential difference caused with the slit 15 sandwiched and the electric field penetrates the sealing plate 4 to be introduced into the reactor 1 (shown in FIG. 3). In other words, the microwave for generating plasma is thus introduced into the reactor 1. When the waveguide antenna part 12 has the aforementioned dimension, each slit 15 has a dimension of 80 mm by 20 mm, and distances from the closed end of the waveguide antenna part 12 to the centers of the respective slits 15 are given by integral multiples of 79.2 mm.

Figure 6:
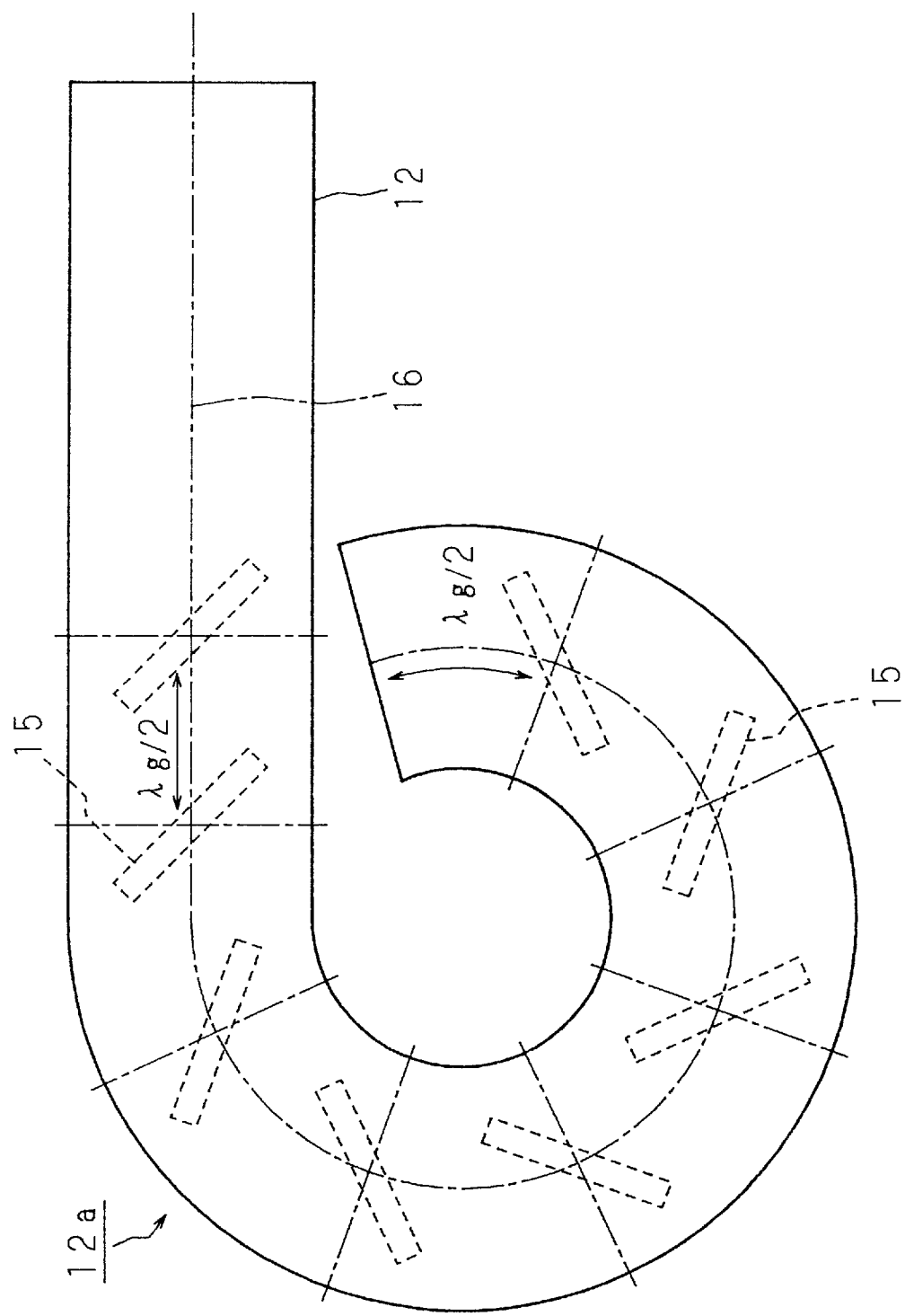
FIG. 6 is an explanatory diagram for illustrating another structure of the slits.
Figure 7:
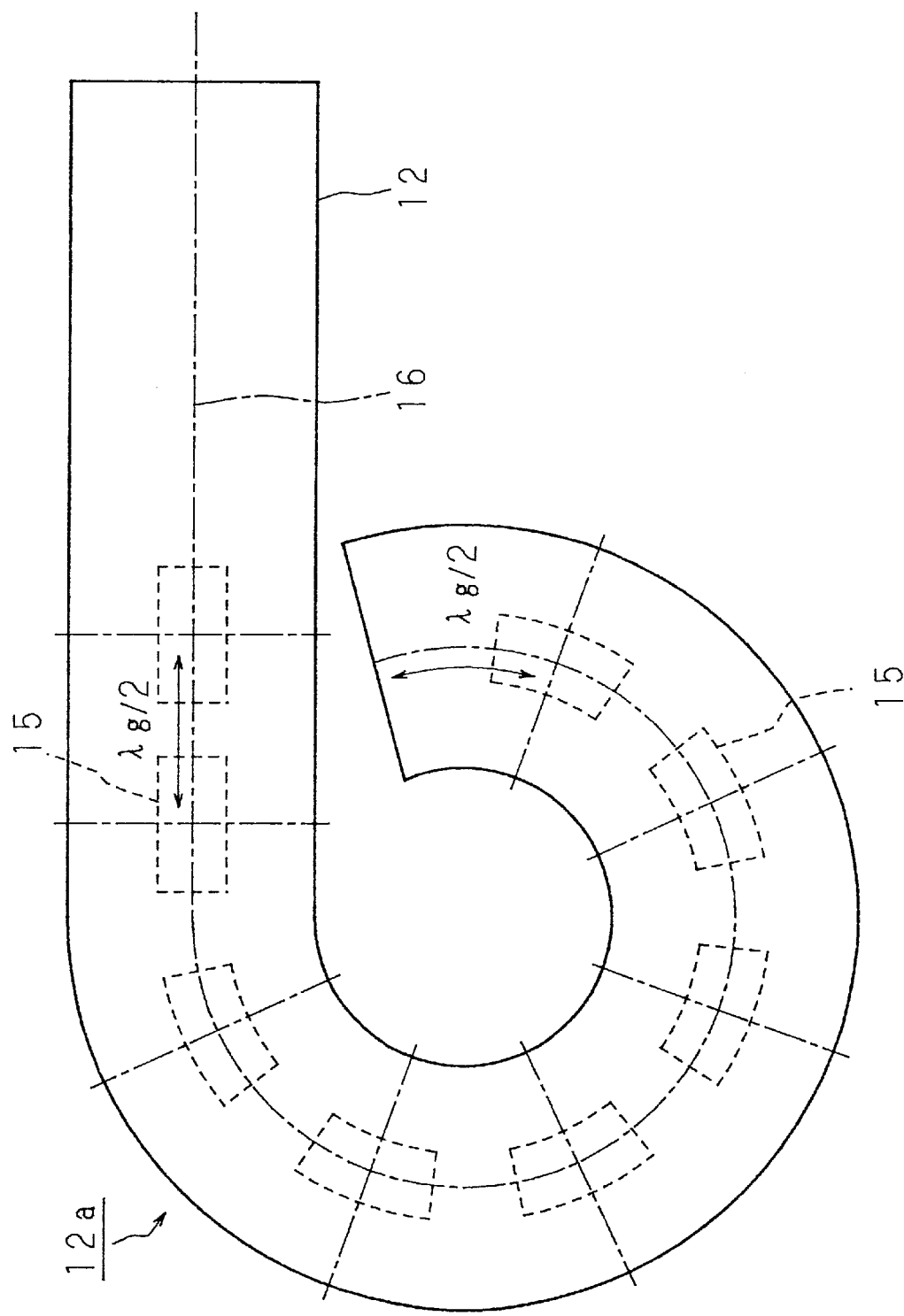
FIG. 7 is an explanatory diagram for illustrating still another structure of the slits.

In this embodiment, each slit 15 is perpendicular to the center axis 16 of the curve portion 12a, which does not limit the invention. The slits can diagonally cross the center axis 16 or can be parallel to the center axis 16. FIG. 6 is an explanatory diagram of slits disposed to cross the center axis 16 at an angle of 45 degrees, and FIG. 7 is an explanatory diagram of slits disposed parallel to the center axis 16. As described below, in some cases, the positions corresponding to the maximum value of the current flowing in the peripheral wall of the waveguide antenna part 12 can be changed because the wavelength of the microwave propagated through the antenna 11 is changed by the plasma generated in the reactor 1. However, when the slits are formed diagonally or parallel to the center axis 16, this change of the positions corresponding to the maximum value of the current can be covered.

As described above, the slits 15) are substantially radially disposed on the covering 10, and hence, the microwave can be uniformly introduced into the entire reactor 1. On the other hand, since the antenna 11 is disposed on the covering 10 having the same diameter as the reactor 1 without projecting from the edge of the covering 10 as is shown in FIG. 3, even when the reactor 1 has a large diameter, the entire dimension of the microwave plasma process apparatus can be made small. Accordingly, the apparatus can be installed in a small space.

The reactor 1 is provided with a through hole penetrating the wall of a process chamber 2, and a desired gas is introduced into the process chamber 2 through a gas inlet tube 5 fit in the through hole. At the center of the bottom of the process chamber 2, a table 3 for placing a sample W is disposed, and the table 3 is connected with a first high frequency power source 7 through a matching box 6. Also, the bottom of the reactor 1 is provided with an air outlet 8, through which the air within the process chamber 2 can be exhausted.

When the surface of the sample W is to be etched by using this microwave plasma process apparatus, the pressure within the process chamber 2 is decreased to a desired pressure by exhausting through the air outlet 8, and then a reaction gas is supplied through the gas inlet tube 5 into the process chamber 2. Subsequently, a microwave is oscillated by the microwave oscillator 20, the microwave is introduced through the waveguide 21 into the antenna 11, where a standing wave is generated. The electric field emitted from each of the slits 15 of the antenna 11 owing to this standing wave penetrates the sealing plate 4 and is introduced into the process chamber 2. Thus, plasma is generated in the process chamber 2, and the surface of the sample W is etched by using this plasma.

Embodiment 2

Figure 8:
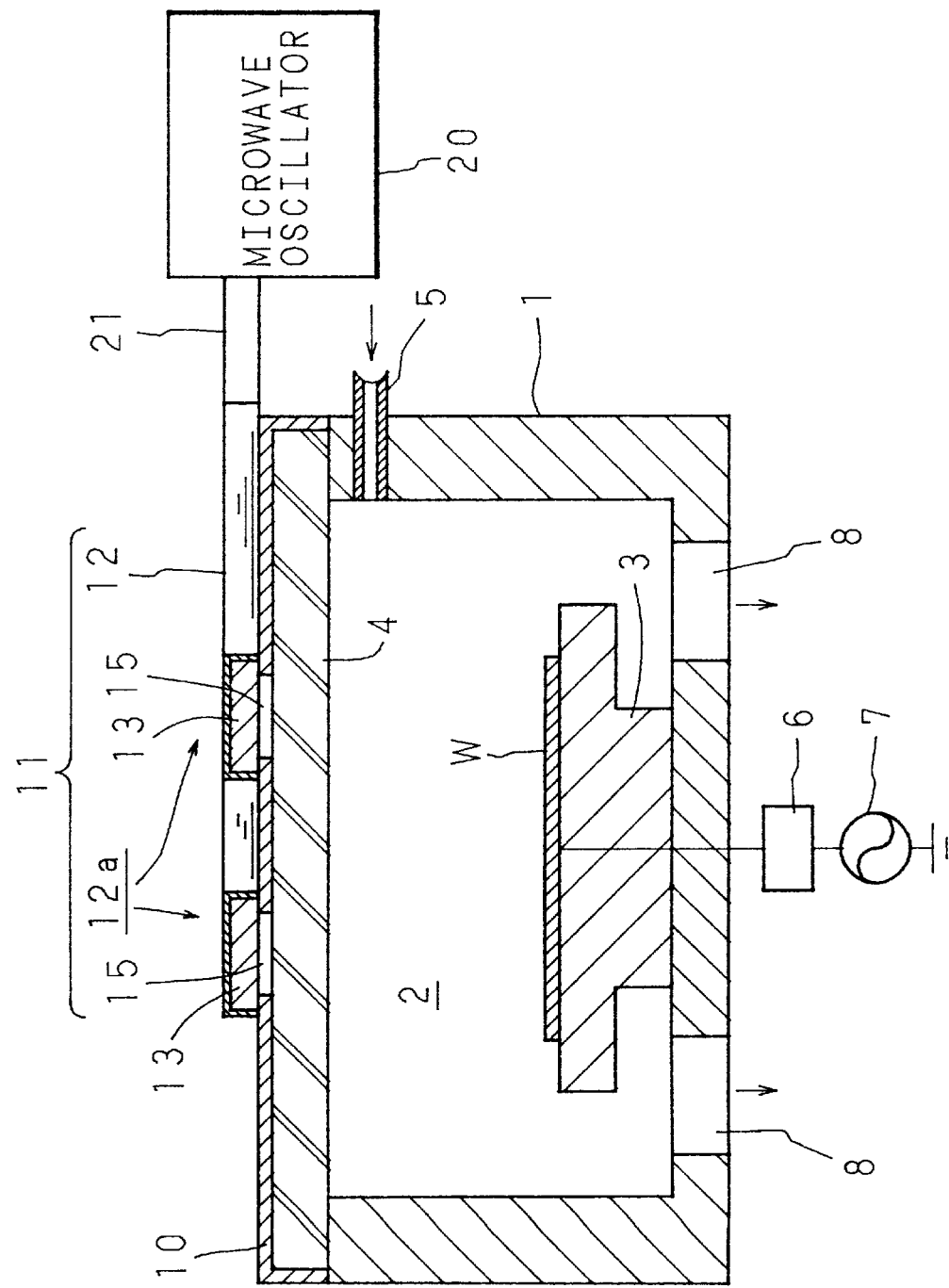
FIG. 8 is a side sectional view for showing the structure of a microwave plasma process apparatus according to a second embodiment of the invention.

FIG. 8 is a side sectional view of a microwave plasma process apparatus according to a second embodiment, wherein a dielectric 13 is contained in an antenna 11. In FIG. 8, like reference numerals are used to refer to like elements shown in FIG. 3, and the description is omitted. As a material for the dielectric 13, a fluororesin such as Teflon (registered tradename), a polyethylene resin or a polystyrene resin having a desired dielectric constant ∈r is selected. The wavelength of a microwave propagated through the dielectric 13 is $1/\sqrt{\sqrt{(\in r)}}$ times as large as, namely, smaller than the wavelength of a microwave propagated through the antenna 11 not containing the dielectric 13. Therefore, as described above, the number of the slits disposed away from the closed end of the waveguide antenna part 12 by the distances of n·λg/2 can be larger than that in the antenna 11 not containing the dielectric 13. As a result, the microwave can be further uniformly introduced into the reactor 1 with the energy loss suppressed.

Embodiment 3

Figure 9:
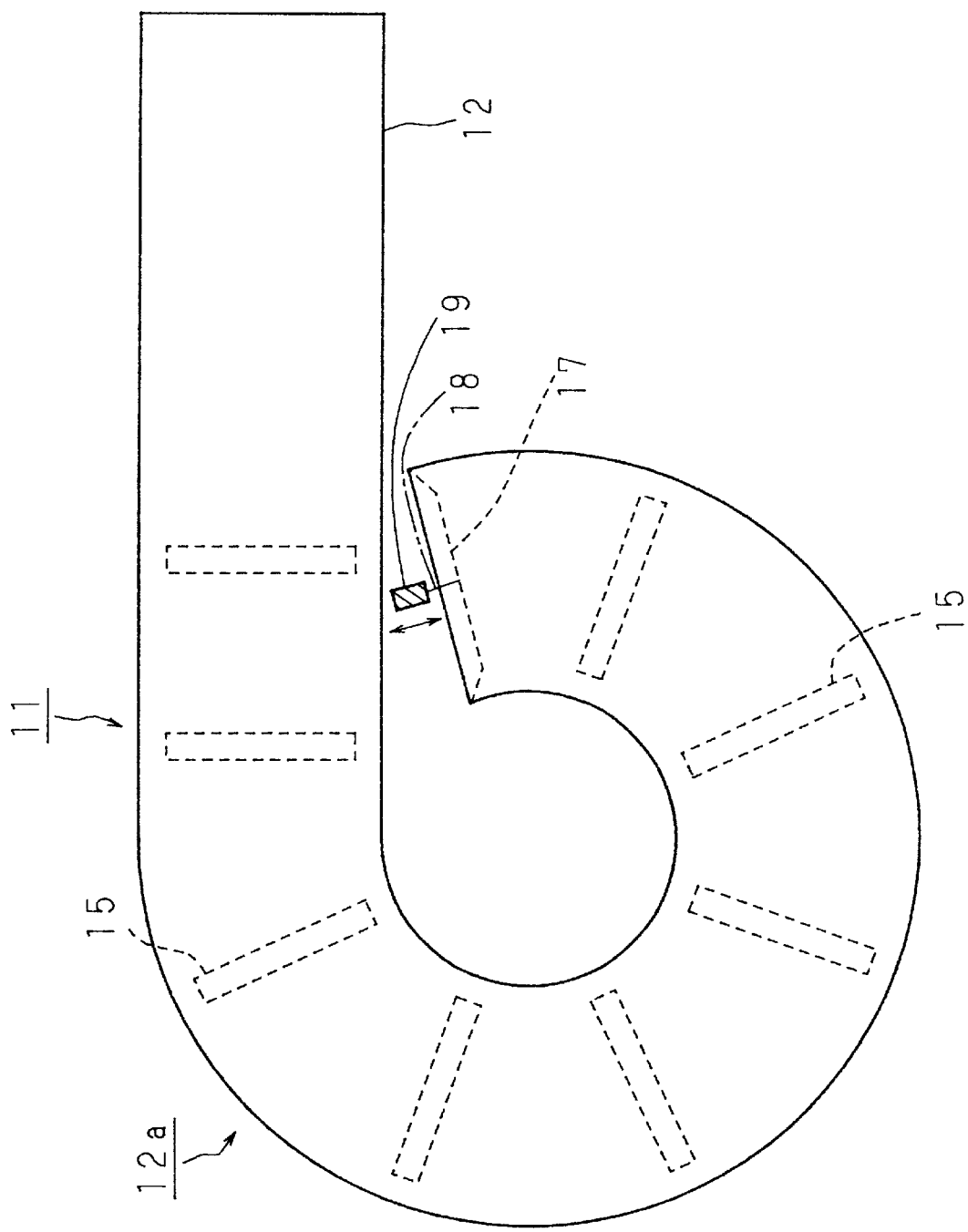
FIG. 9 is a partial plan view for showing the structure of a microwave plasma process apparatus according to a third embodiment of the invention.

FIG. 9 is a partial plan view of a microwave plasma process apparatus according to a third embodiment of the invention, wherein the effective length of an antenna 11 can be adjusted. A through hole is provided on an end face of a waveguide antenna part 12 of the antenna 11, and a plunger 18 is movably inserted into the through hole. The plunger 18 is provided, at its base, with a stopper 19 having a larger diameter than the through hole, so that the movement of the plunger 18 toward the inside of the waveguide antenna part 12 can be held by the stopper 19. Also, at a portion slightly inside from the end face of the waveguide antenna part 12, a conductive movable plate (closing member) 17 having an inside diameter the same as the outside diameter of the waveguide antenna part 12 is movably fit, and the edge of the movable plate 17 is tapered. The tip of the plunger 18 is connected with the movable plate 17, so that the position of the movable plate 17 in the longitudinal direction of the waveguide antenna part 12 can be adjusted by moving the plunger 18 forward and backward.

A microwave having entered the waveguide antenna part 12 is reflected by the movable plate 17, and a standing wave is generated. Slits 15 are disposed away, by the distances of n·λg/2, from the movable plate 17 placed in contact with the end face of the waveguide antenna part 12 on the basis of the wavelength 80 g of the microwave entering the waveguide antenna part 12.

In this microwave plasma process apparatus, plasma is generated with the movable plate 17 set in contact with the end face of the waveguide antenna part 12, and the distance between the movable plate 17 and the end face of the waveguide antenna part 12 is increased, namely, the movable plate 17 is moved toward the center of the waveguide antenna part 12 as the density of the plasma in a process chamber 2 (as is shown in FIG. 3) is increased.

When the process chamber 2 where the plasma is generated is close to the antenna 11, the wavelength of the microwave introduced into the antenna 11 is decreased as the density of the plasma generated in the process chamber is increased. In accordance with the decrease of the wavelength of the microwave, the interval between the maximum values of the current flowing in the peripheral wall of the waveguide antenna part 12 is decreased. However, according to this embodiment, as the density of the plasma in the process chamber is increased, the distance between the movable plate 17 and the end face of the waveguide antenna part 12 is increased, thereby decreasing the distances between the movable plate and the respective slits 15. As a result, the positions corresponding to the maximum value of the current flowing in the peripheral wall of the waveguide antenna part 12 can be adjusted to accord with the positions of the slits 15. In this manner, a microwave can be uniformly introduced into the process chamber 2 as well as a microwave with a high intensity can be introduced even when the density of the plasma in the process chamber is increased.

Embodiment 4

Figure 10:
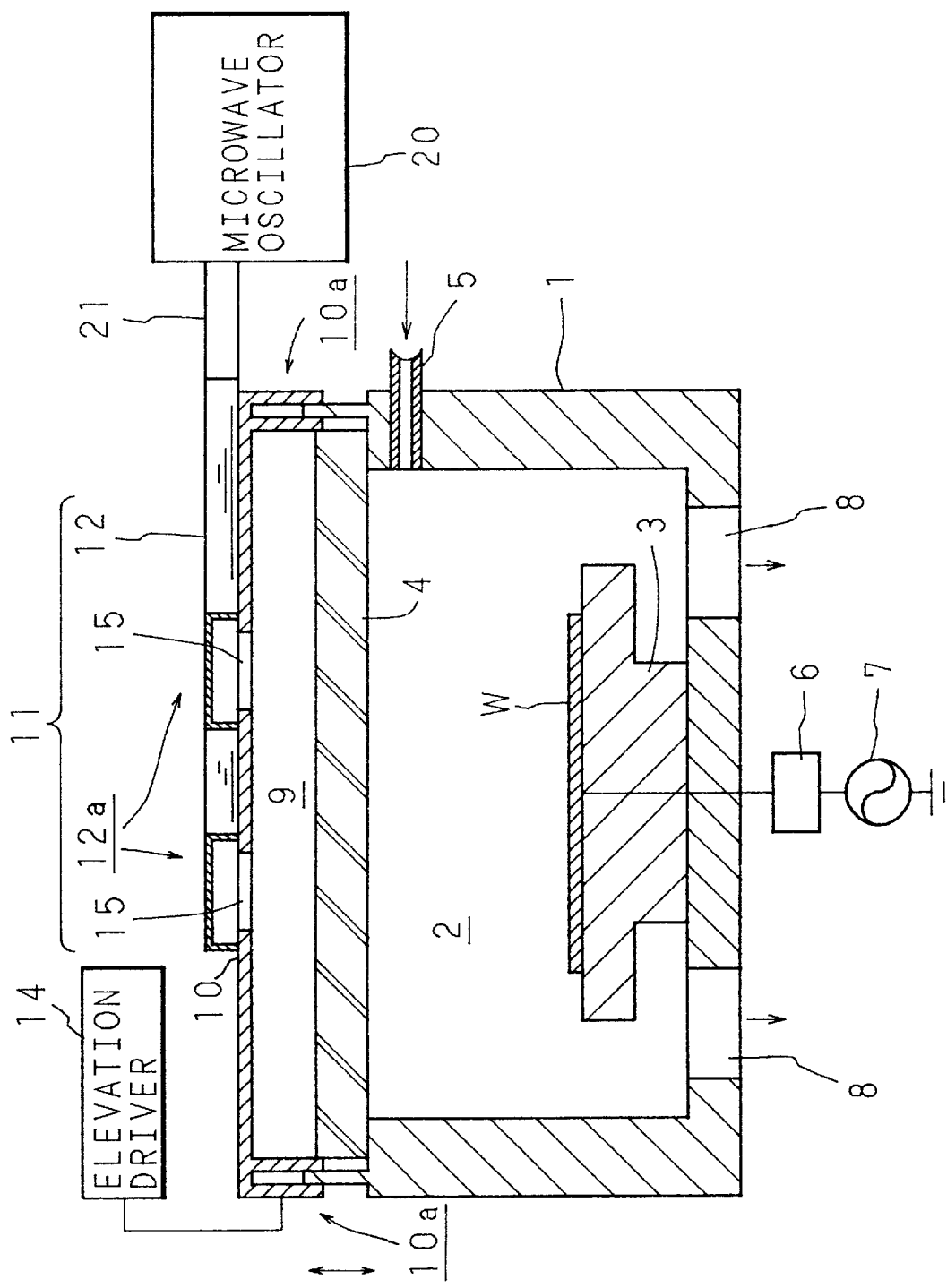
FIG. 10 is a side sectional view for showing the structure of a microwave plasma process apparatus according to a fourth embodiment of the invention.

FIG. 10 is a side sectional view of a microwave plasma process apparatus according to a fourth embodiment, wherein the dimension of an air gap 9 disposed between an antenna 11 and a sealing plate 1 can be adjusted. In FIG. 10, like reference numerals are used to refer to like elements shown in FIG. 3, and the description is omitted. At the edge of the covering 10, an elevating portion 10a is provided, and the elevating portion 10a is connected with an elevation driver 14 for lifting up down the covering 10. By driving the elevation driver 14, the covering 10 and the antenna 11 disposed on the covering 10 are lifted up down, so that the thickness of the air gap 9 disposed between the covering 10 and the sealing plate 4 can be adjusted.

In etching the surface of a sample W by using this microwave plasma process apparatus, the dimension of the air gap 9 is first set at 0 and the pressure within the process chamber 2 is decreased to a desired pressure by exhausting the air through the air outlet 8, and then, a reaction gas is supplied into the process chamber 2 through the gas inlet tube 5. Subsequently, a microwave is oscillated by the microwave oscillator 20, and the microwave is introduced through the waveguide 21 into the antenna 11, where a standing wave is generated. The standing wave allows an electric field to be emitted from each of the slits 15 of the antenna 11 and the electric field penetrates the sealing plate 4, so as to generate plasma in the process chamber 2. As the density of the generated plasma is increased, the covering 10 is lifted up by using the elevation driver 14 so as to increase the dimension of the air gap 9, while the surface of the sample W is being etched.

When the density of the plasma generated in the process chamber is increased, the wavelength of the microwave propagated through the antenna 11 is decreased due to coupling of the antenna 11 and the plasma, resulting in changing the positions corresponding to the maximum value of the current flowing in the wall of the antenna 11. According to this embodiment, since the dimension of the air gap 9 is increased by lifting up the covering 10 by using the elevation driver 14 as the density of the plasma in the process chamber is increased, the coupling between the antenna 11 and the plasma within the process chamber 2 can be weakened. As a result, the wavelength of the microwave propagated through the antenna 11 can he prevented from decreasing. The density of the plasma within the process chamber 2 can be detected by, for example, detecting light emission accompanied with the generation of plasma by using an optical fiber.

In the aforementioned first through fourth embodiments, it is necessary to have a predetermined distance between the antenna and the sample in order to uniformly treat the entire surface of the sample with plasma. Now, description will be given on a microwave plasma process apparatus in which the plasma process can be made uniform in all area of the sample face even when the distance between the antenna and the sample is small.

Embodiment 5

Figure 11:
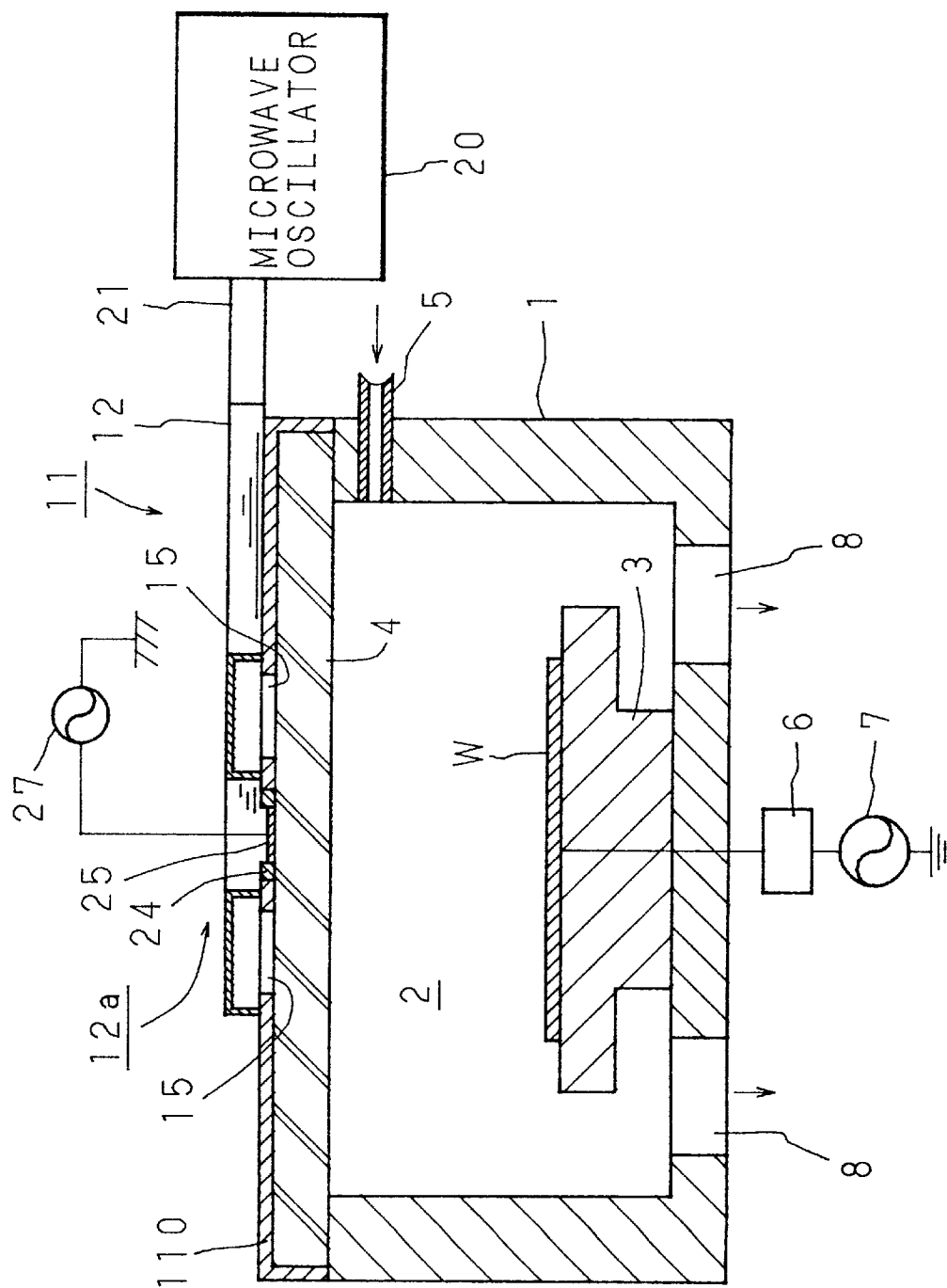
FIG. 11 is a side sectional view for showing the structure of a microwave plasma process apparatus according to a fifth embodiment of the invention.
Figure 12:
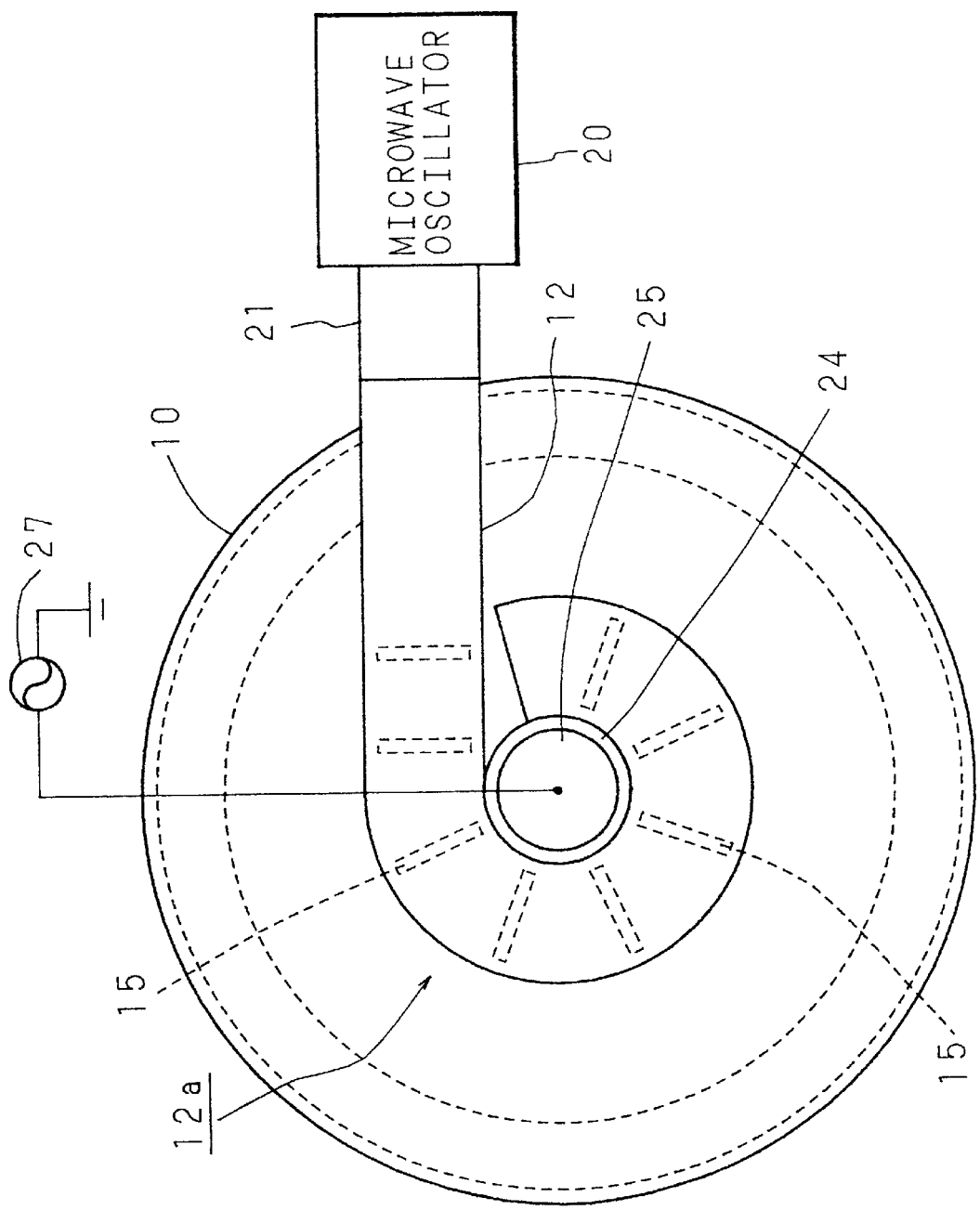
FIG. 12 is a plan view of the microwave plasma process apparatus of FIG. 11.

FIG. 11 is a side sectional view for showing the structure of a microwave plasma process apparatus according to a fifth embodiment, and FIG. 12 is a plan view of the microwave plasma process apparatus of FIG. 11. In FIGS. 11 and 12, like reference numerals are used to refer to like elements shown in FIG. 3.

The upper face and the outer circumference of the sealing plate 4 is covered with a covering 110 made from a conductive metal in the shape of a circular cap and having a circular hole at the center thereof, and the covering 110 is fixed on the reactor 1. The antenna 11 for introducing a microwave into the reactor 1 is disposed around the hole of the covering 110.

In this embodiment, the slits 15 are formed so as to perpendicular to the center axis 16 of the curve portion 12a, which does not limit the invention. The slits can be formed so as to diagonally cross the center axis 16 or can be parallel to the center axis 16 (as is shown in FIGS. 6 and 7).

In the inner circumference of the hole formed at the center of the covering 110, a ring-shaped insulating member 24 is fit, and a disk-shaped electrode 25 having substantially the same thickness as the covering 110 is fit in the insulating member 24. When the antenna 11 having the aforementioned dimension is used, the diameter of the electrode 25 is approximately 100 mm. The electrode 25 is connected with a second high frequency power supply 27 through a coaxial cable, so that the second high frequency power supply 27 can apply a high frequency of 13.56 MHz to the electrode 25.

In etching the surface of a sample W by using this microwave plasma process apparatus, after decreasing the pressure within the process chamber 2 to a desired pressure by exhausting through the air outlet 8, a reaction gas is supplied into the process chamber 2 through the gas inlet tube 5. Then, a microwave of 2.45 GHz is oscillated by the microwave oscillator 20, the microwave is introduced through the waveguide 21 to the antenna 11, where a standing wave is generated. The standing wave allows an electric field to be emitted from each of the slits 15 of the antenna 11 into the process chamber 2, thereby generating plasma in areas corresponding to the respective slits 15 in the vicinity of the sealing plate 4 within the process chamber 2. The high frequency of 13.56 MHz is applied to the electrode 25 by the second high frequency power supply 27, thereby generating plasma in an area corresponding to the electrode 25 in the vicinity of the sealing plate 4 within the process chamber 2. The plasma generated in these areas is diffused from the respective areas and propagated to the table 3, so that the substantially uniformly diffused plasma etches the surface of the sample W placed on the table 3. In this manner, since the plasma is generated also in the area corresponding to the center of the antenna 11, even when the distance between the table 3 and the sealing plate 4 is small, namely, even when a diffusion distance of the plasma is small, it is possible to obtain substantially uniform plasma on the same plane as the surface of the table 3. As a result, the vertical size of the apparatus can become more smaller and the plasma process speed can be increased.

Furthermore, the plasma can be generated within the process chamber 2 by applying the high frequency field to the electrode 25 in addition to the plasma generated by the microwave oscillated by the microwave oscillator 20 and emitted from the antenna 11. Therefore, the plasma process speed at the center and at the edge of the sample can be made uniform by controlling the power of the high frequency field applied to the electrode 25 without adjusting the power of the microwave oscillated by the microwave oscillator 20.

Embodiment 6

Figure 13:
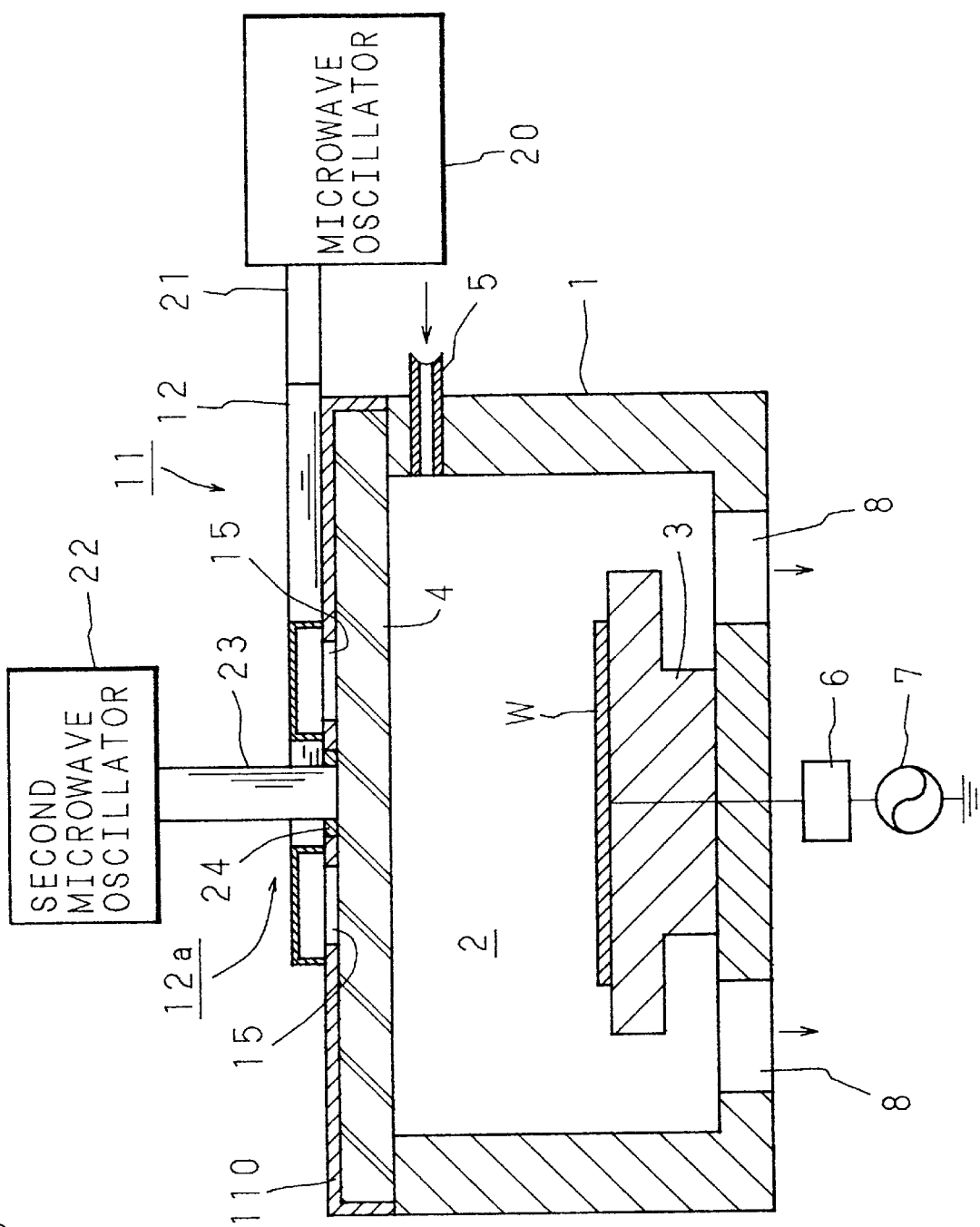
FIG. 13 is a side sectional view for showing the structure of a microwave plasma process apparatus according to a sixth embodiment of the invention.

FIG. 13 is a side sectional view of a microwave plasma process apparatus according to a sixth embodiment, wherein the second high frequency power supply 27 of the fifth embodiment is replaced with a second microwave oscillator 22. In FIG. 13, like reference numerals are used to refer to like elements shown in FIG. 11, and the description is omitted. As is shown in FIG. 13, in the circular hole formed at the center of the covering 110, one end of a second waveguide 23 in a cylindrical shape is fit with the insulating member 24 sandwiched therebetween. The other end of the second waveguide 23 is connected with the second microwave oscillator 22 for oscillating a microwave of 2.45 GHz.

In this microwave plasma process apparatus, a microwave of 2.45 GHz is oscillated by the microwave oscillator 20, the microwave is introduced through the waveguide 21 into the antenna 11, and an electric field is emitted into the process chamber 2 from each of the slits 15 of the antenna 11 in the same manner as in the aforementioned embodiment. Thus, plasma is generated in areas respectively corresponding to the slits 15 in the vicinity of the sealing plate 4 within the process chamber 2. Also, the microwave of 2.45 GHz is oscillated by the second microwave oscillator 22, and the microwave is introduced to the center of the sealing plate 4 by the second waveguide 23 and further introduced into the process chamber 2 from the center of the sealing plate 4. Thus, plasma is generated in an area corresponding to the opening of the second waveguide 23 in the vicinity of the sealing plate I within the process chamber 2. In this manner, even when the distance between the table 3 and the sealing plate 4 is small, it is possible to obtain substantially uniform plasma on the same plane as the surface of the table 3. As a result, the vertical size of the apparatus can become more smaller and the plasma process speed can be increased.

Furthermore, the plasma can be generated within the process chamber 2 by the microwave oscillated by the second microwave oscillator 22 and introduced into the process chamber 2 by the second waveguide 23 in addition to the plasma generated by the microwave oscillated by the microwave oscillator 20 and emitted from the antenna 11. Therefore, the plasma process speed at the center and at the edge of the sample can be made uniform by controlling the power of the microwave oscillated by the second microwave oscillator 22 without adjusting the power of the microwave oscillated by the microwave oscillator 20.

Embodiment 7

Figure 1:
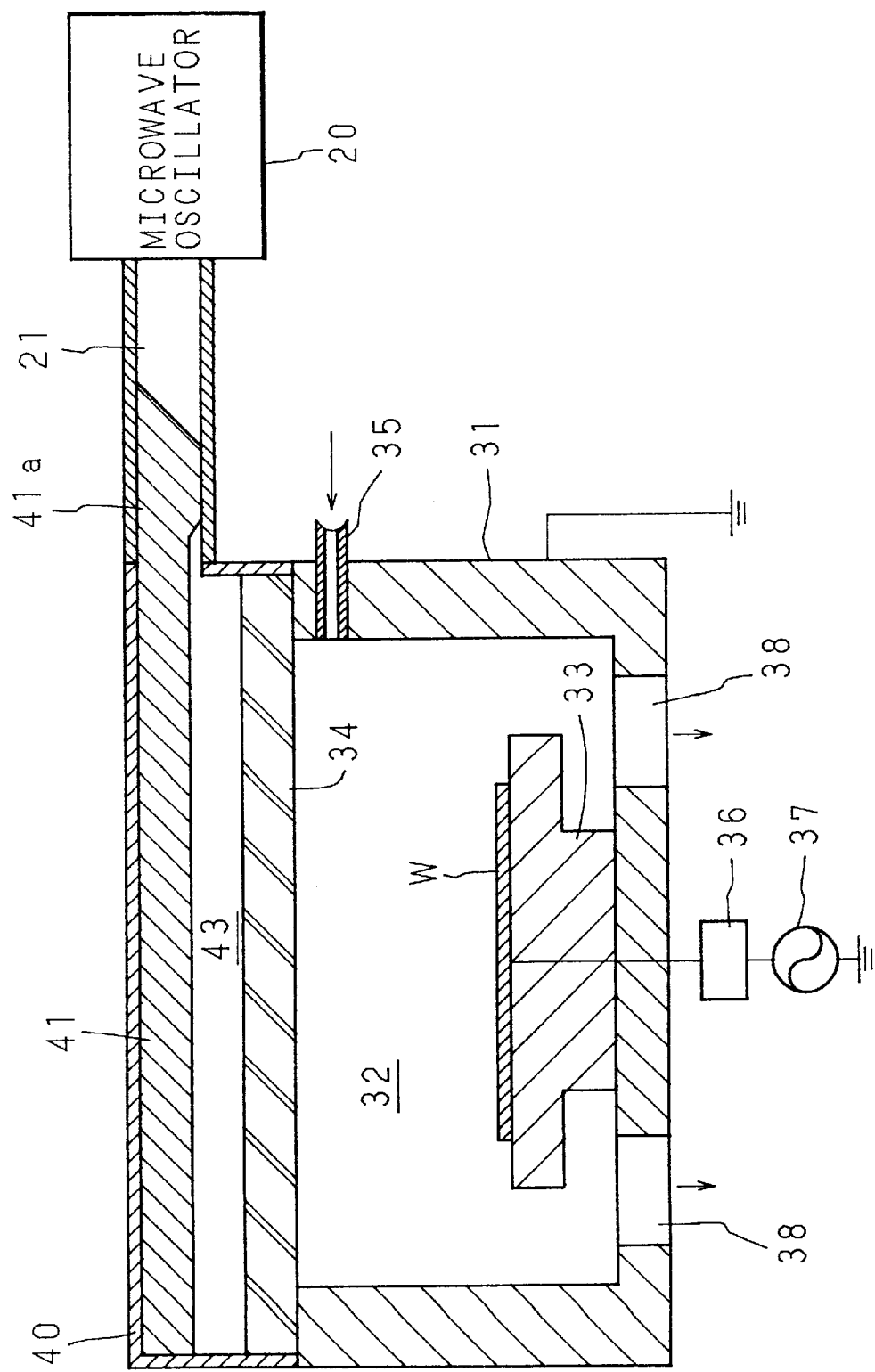
FIG. 1 is a side sectional view of a conventional microwave plasma process apparatus.
Figure 2:
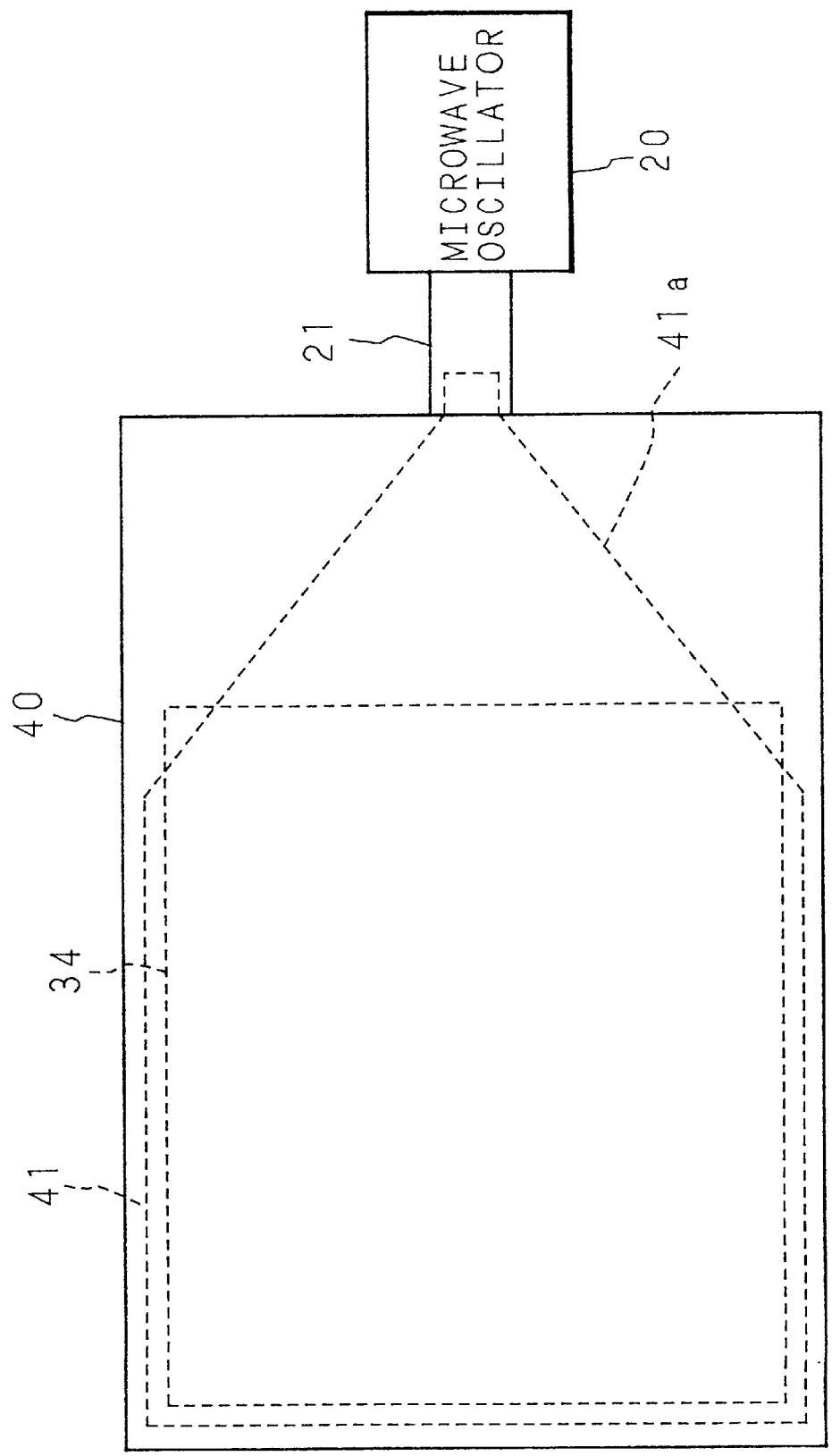
FIG. 2 is a plan view of the plasma process apparatus of FIG. 1.
Figure 14:
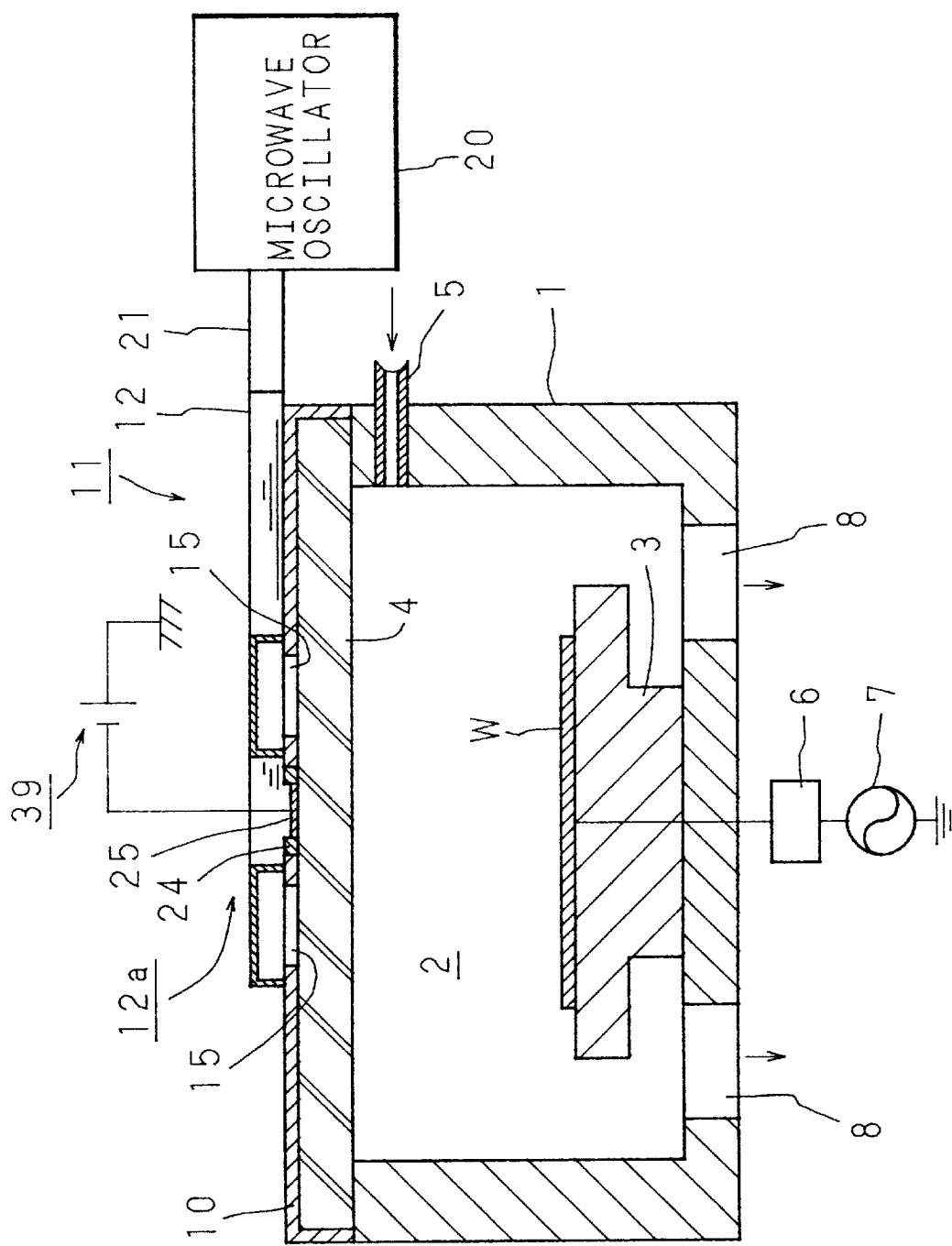
FIG. 14 is a side sectional view for showing the structure of a microwave plasma process apparatus according to a seventh embodiment of the invention.

FIG. 14 is a side sectional view of a microwave plasma process apparatus according to a seventh embodiment, wherein the high frequency power supply 27 of FIG. 11 is replaced with a DC power supply 39 for applying a DC voltage to the electrode 25. In FIG. 14, like reference numerals are used to refer to like elements shown in FIG. 11, and the description is omitted. As is shown in FIG. 1 4, the electrode 25 is connected with the negative terminal of the DC power supply 39, so that a predetermined negative voltage can be applied to the electrode 25 by the DC power supply 39.

In this microwave plasma process apparatus, a microwave of 2.45 GHz is oscillated by the microwave oscillator 20, the microwave is introduced through the waveguide 21 into the antenna 11, and an electric field is emitted into the process chamber 2 from each of the slits 15 of the antenna 11 in the same manner as in the aforementioned embodiment. Thus, plasma is generated in areas respectively corresponding to the slits 15 in the vicinity of the sealing plate 4 within the process chamber 2. Also, the negative voltage is applied to the electrode 25 by the DC power supply 39 for a predetermined time period, thereby moving positive ions included in the plasma generated in the aforementioned manner toward the center axis of the process chamber 2. As a result, even when the distance between the table 3 and the sealing plate 4 is small, it is possible to obtain substantially uniform plasma on the same plane as the surface of the table 3, so as to increase the plasma process speed and to make the vertical size of the apparatus small.

Embodiment 8

Figure 15:
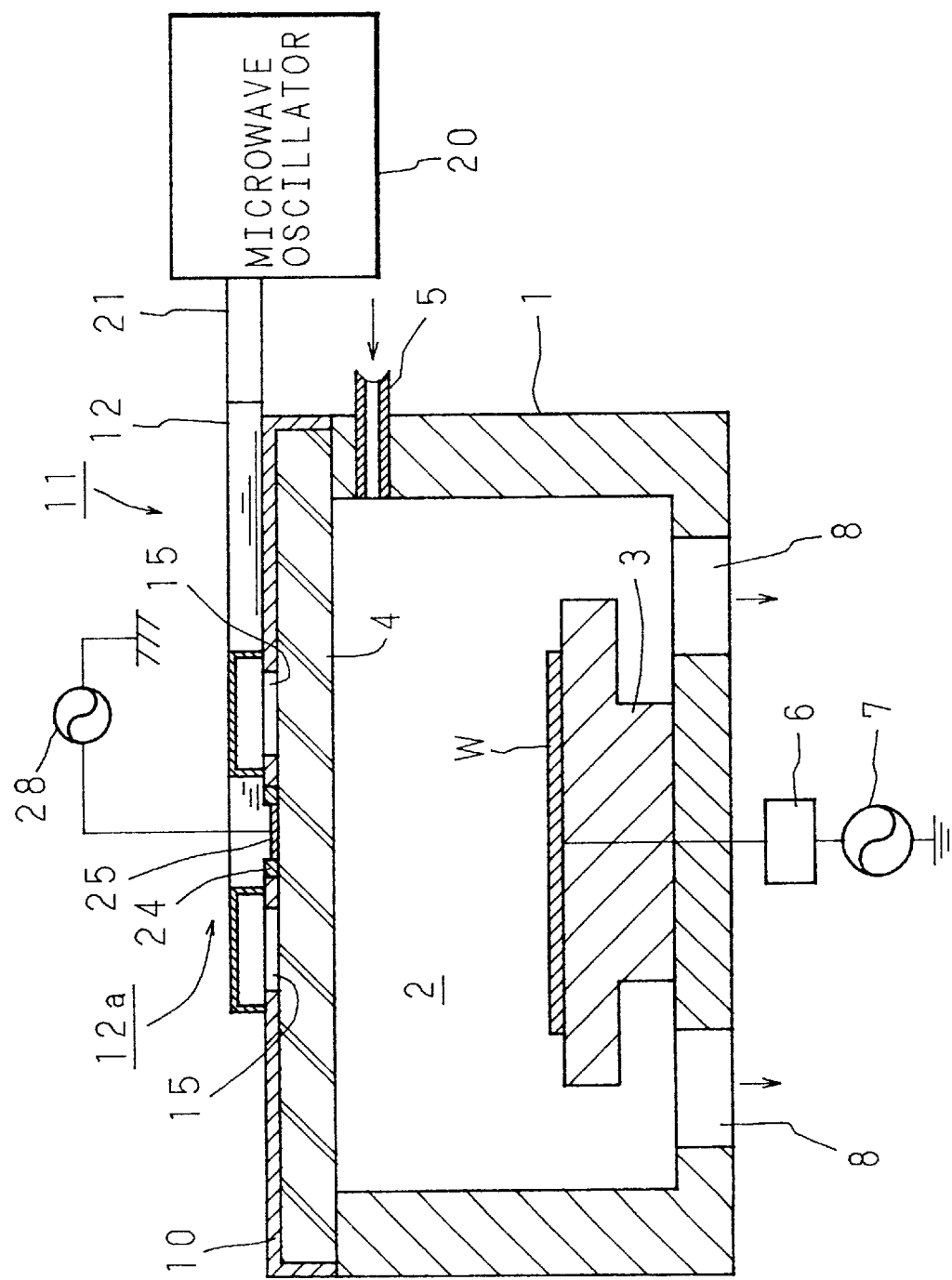
FIG. 15 is a side sectional view for showing the structure of a microwave plasma process apparatus according to an eighth embodiment of the invention.

FIG. 15 is a side sectional view of a microwave plasma process apparatus according to an eighth embodiment, wherein the second high frequency power supply 27 of FIG. 11 is replaced with a low frequency power supply 28 for applying a low frequency of 400 KHz to the electrode 25. In FIG. 15, like reference numerals are used to refer to like elements shown in FIG. 11, and the description is omitted. As is shown in FIG. 15, the electrode 25 is connected with the output terminal of the low frequency power supply 37, so that the low frequency power supply 37 can apply the low frequency of 400 KHz to the electrode 25.

In this microwave plasma process apparatus, a microwave of 2.45 GHz is oscillated by the microwave oscillator 20, the microwave is introduced through the waveguide 21 into the antenna 11, and an electric field is emitted into the process chamber 2 from each of the slits 15 of the antenna 11 in the same manner as in the aforementioned embodiment. Thus, plasma is generated in areas respectively corresponding to the slits 15 in the vicinity of the sealing plate 4 within the process chamber 2. Also, the low frequency of 400 KHz is applied to the electrode 25 by the low frequency power supply 28. In applying an electric field of such a low frequency, positive ions included in the plasma generated in the process chamber 2 are moved toward the center of the process chamber 2 when the electric field is negative and moved in the reverse direction when the field is positive. Accordingly, the diffusion efficiency of the plasma can he improved while stably retaining the state of the generated plasma. As a result, even when the distance between the table 3 and the sealing plate 4 is small, it is possible to obtain substantially uniform plasma on the same plane as the surface of the table 3 similarly to the aforementioned embodiments. Thus, the vertical size of the apparatus can become more smaller and the plasma process speed can be increased.

In this embodiment, the low frequency power supply 28 applies the low frequency of 400 KHz to the electrode 25, but the frequency is not limited to 400 KHz hut can be 200 KHz through 2 MHz.

Next, description will be given on a plasma process apparatus in which the usage efficiency of a reaction gas is improved.

Embodiment 9

Figure 16:
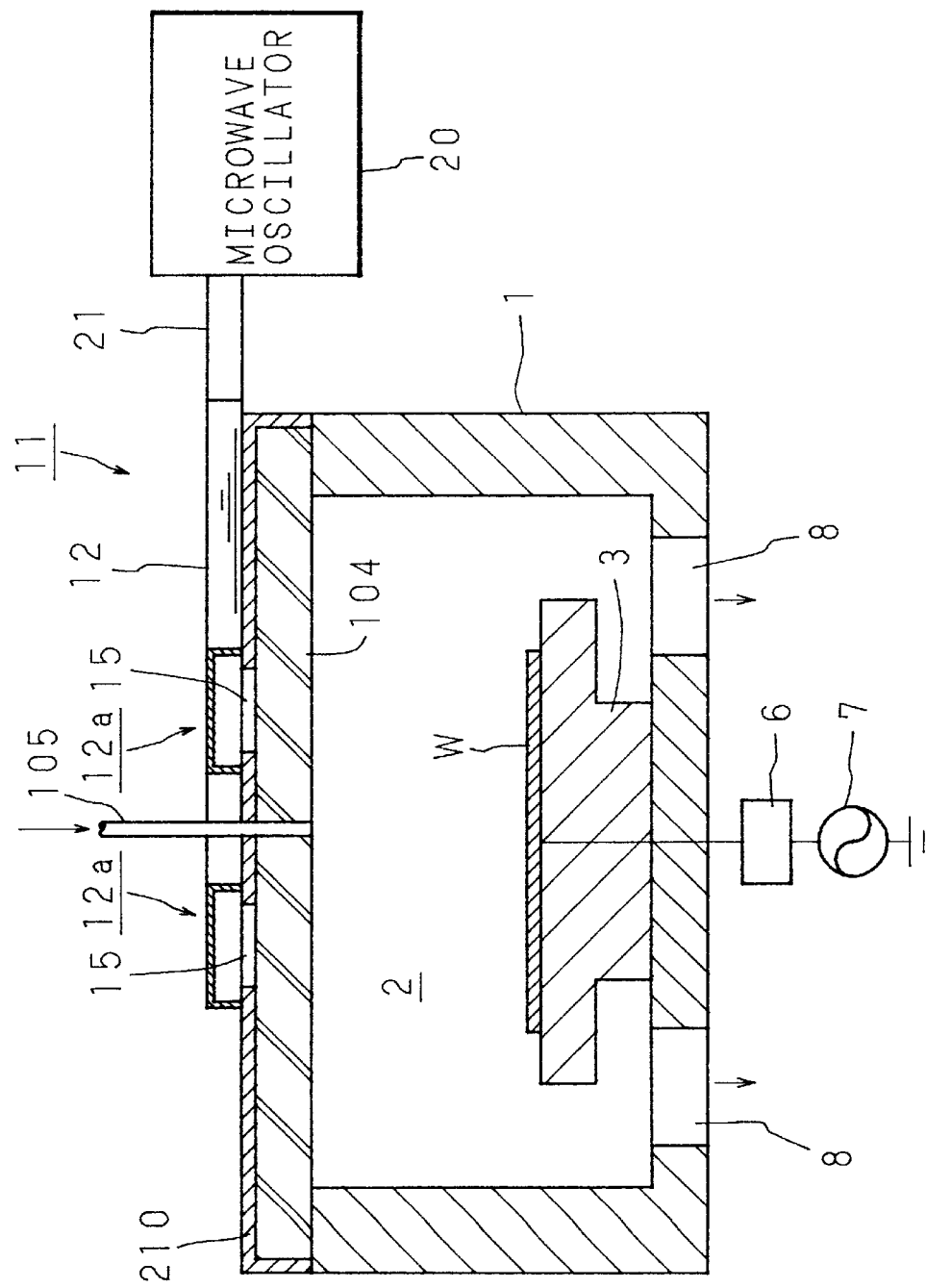
FIG. 16 is a side sectional view for showing the structure of a microwave plasma process apparatus according to a ninth embodiment of the invention.
Figure 17:
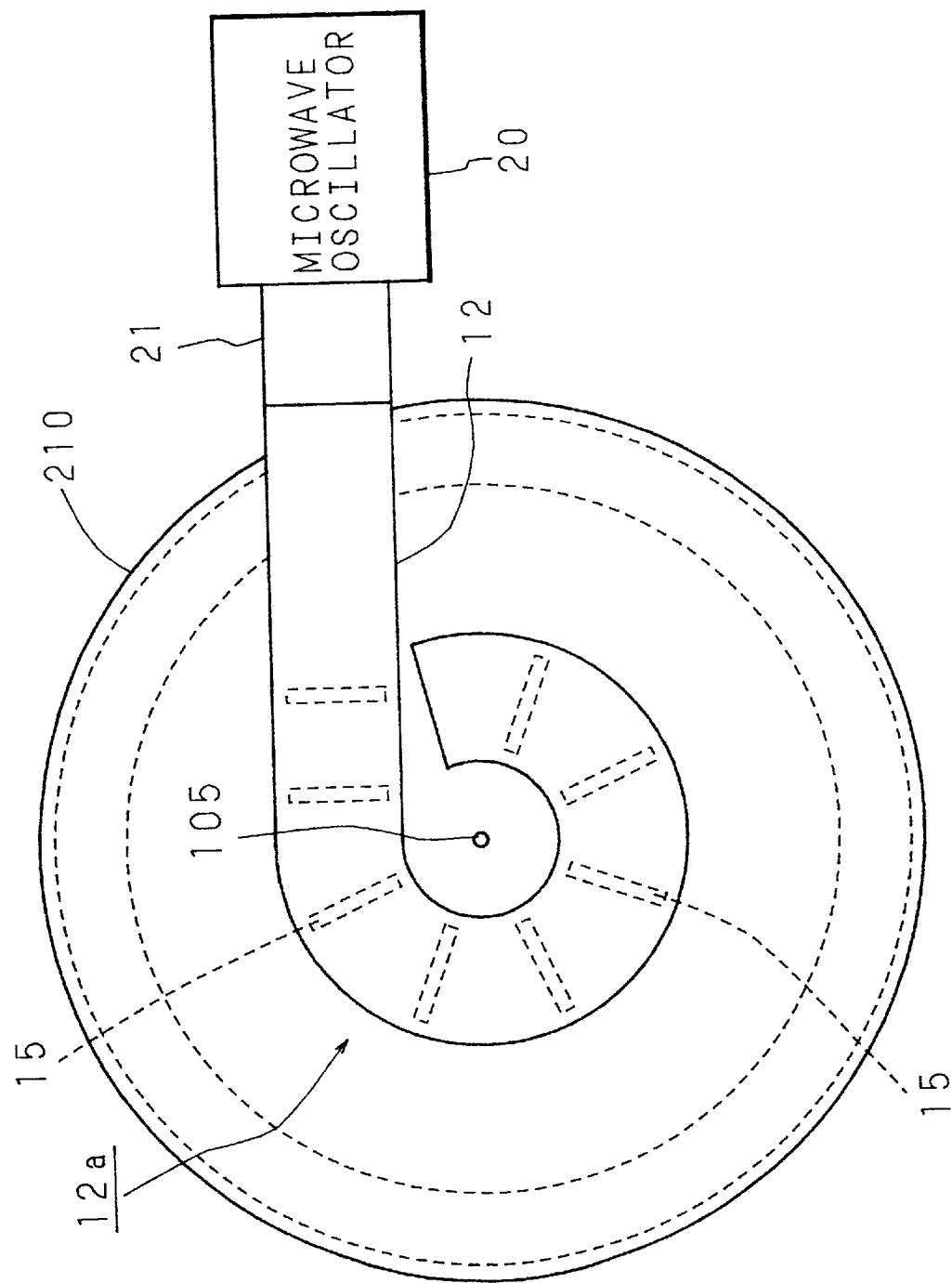
FIG. 17 is a plan view of the microwave plasma process apparatus of FIG. 16.

FIG. 16 is a side sectional view for showing the structure of a microwave plasma process apparatus according to a ninth embodiment, and FIG. 17 is a plan view of the microwave plasma process apparatus of FIG. 16. In FIGS. 16 and 17, like reference numerals are used to refer to like elements shown in FIG. 3, and the description is omitted.

A sealing plate 104 which has a through hole formed at the center thereof is fit in a covering 210 made from a conductive metal in the shape of a circular cap and having a through hole formed at the center thereof, and the covering 210 is fixed on the reactor 1. The covering 210 is provided with the antenna 11 for introducing a microwave into the reactor 1.

At substantially the center of a portion of the covering 210 surrounded with the waveguide antenna part 12, namely, in substantially the same position as the center axis of the reactor 1, a through hole penetrating the covering 210 and the sealing plate 104 is formed, so that a desired gas can be introduced into the process chamber 2 through a gas inlet tube (gas inlet tube) 105 fit in the through hole.

In this embodiments, the slits 15 are formed so as to be perpendicular to the center axis 16 of the curve portion 12a, which does not limit the invention. The slits can be formed so as to diagonally cross the center axis 16 or can be parallel to the center axis 16 (as is shown in FIGS. 6 and 7).

In this embodiment, the waveguide antenna part 12 is hollow, which does not limit the invention, and a dielectric can be fit in the waveguide antenna part 12. When a dielectric is fit in the waveguide antenna part 12, the wavelength of a microwave entering the waveguide antenna part 12 can be decreased to be $1/\sqrt{\sqrt{(\in r)}}$ (wherein $\in r$ is a dielectric constant of the dielectric) times as large as that entering the waveguide antenna part 12 not containing the dielectric. Accordingly, in using the waveguide antenna part 12 having the same dimension, the number of positions corresponding to the maximum current value of a current flowing in the wall of the waveguide antenna part is larger when the dielectric is contained than when the dielectric is not contained. Therefore, the number of the slits 15 can be increased. Accordingly, the microwave can he more uniformly introduced into the process chamber 2.

In etching the surface of a sample W by using this microwave plasma process apparatus, the pressure within the process chamber 2 is decreased to a desired pressure by exhausting through the air outlet 8, and then, a reaction gas is supplied into the process chamber 2 through the gas inlet tube 105. Subsequently, a microwave of 2.45 GHz is oscillated by the microwave oscillator 20, and the microwave is introduced through the waveguide 21 to the antenna 11, where a standing wave is generated. This standing wave allows an electric field to be emitted from each of the slits into the process chamber 2. Thus, plasma is generated in areas respectively corresponding to the slits 15 in the vicinity of the sealing plate 104 within the process chamber 2.

Since the reaction gas is supplied into the process chamber 2 through the gas inlet tube 105 disposed in substantially the same position as the center axis of the reactor 1 as described above, the reaction gas is radially diffused toward the entire periphery from substantially the center of the process chamber 2. Accordingly, the reaction gas is uniformly supplied onto the sample W, and the plasma is generated in a substantially uniform density on the entire surface of the sample W. As a result, the sample W can he treated at a uniform speed. Furthermore, most of the reaction gas is supplied to the plasma generated in the process chamber 2, and the supplied reaction gas can remain in the plasma for a comparatively long period of time. Accordingly, the usage efficiency of the reaction gas can be improved. On the other hand, since the gas inlet tube 105 is disposed in the portion of the covering 210 surrounded with the waveguide antenna part 12, the gas inlet tube 105 does not harmfully affect the microwave propagated through the waveguide antenna part 12.

Embodiment 10

Figure 18:
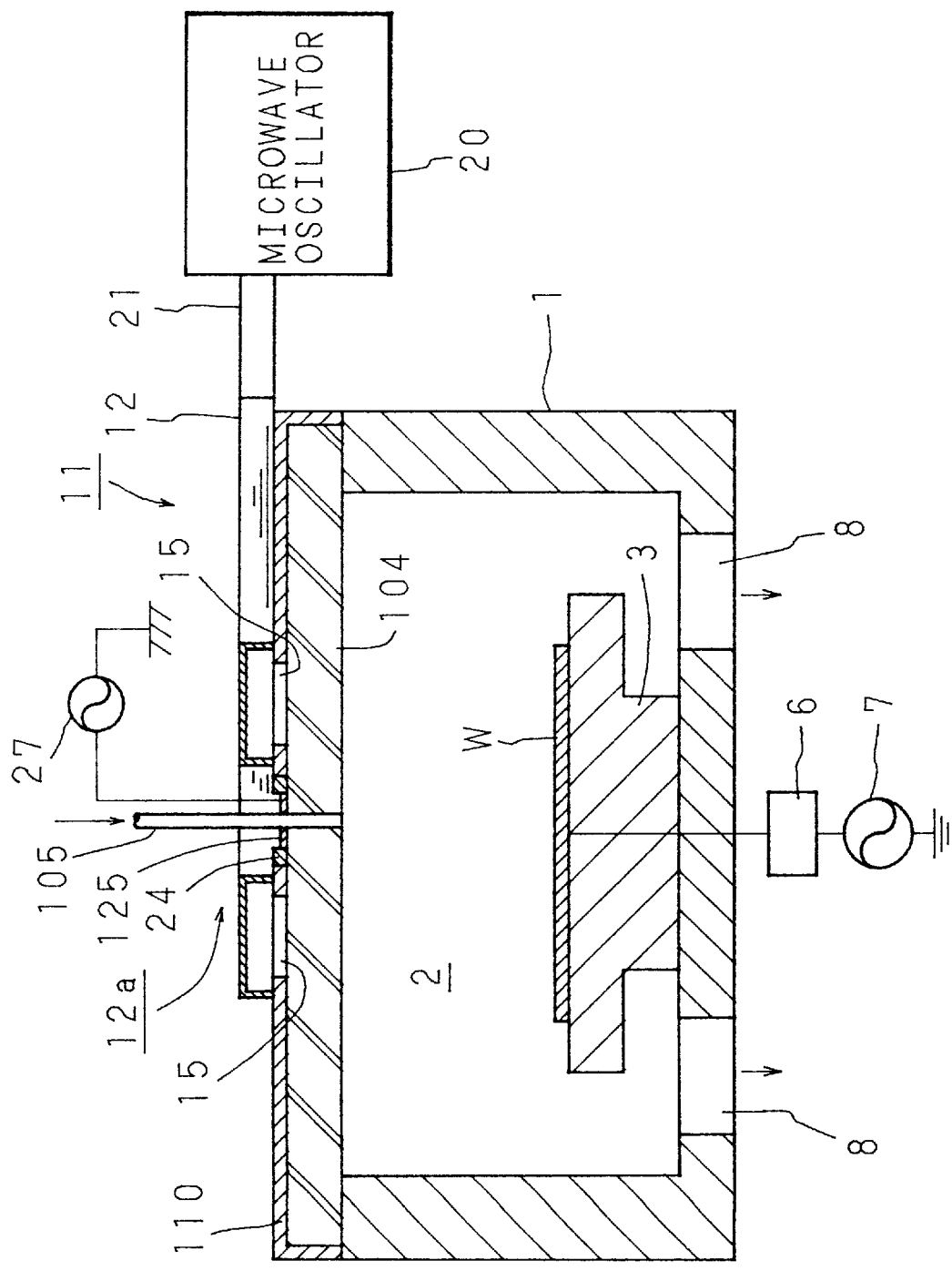
FIG. 18 is a side sectional view for showing a structure of a microwave plasma process apparatus according to a tenth embodiment of the invention.
Figure 19:
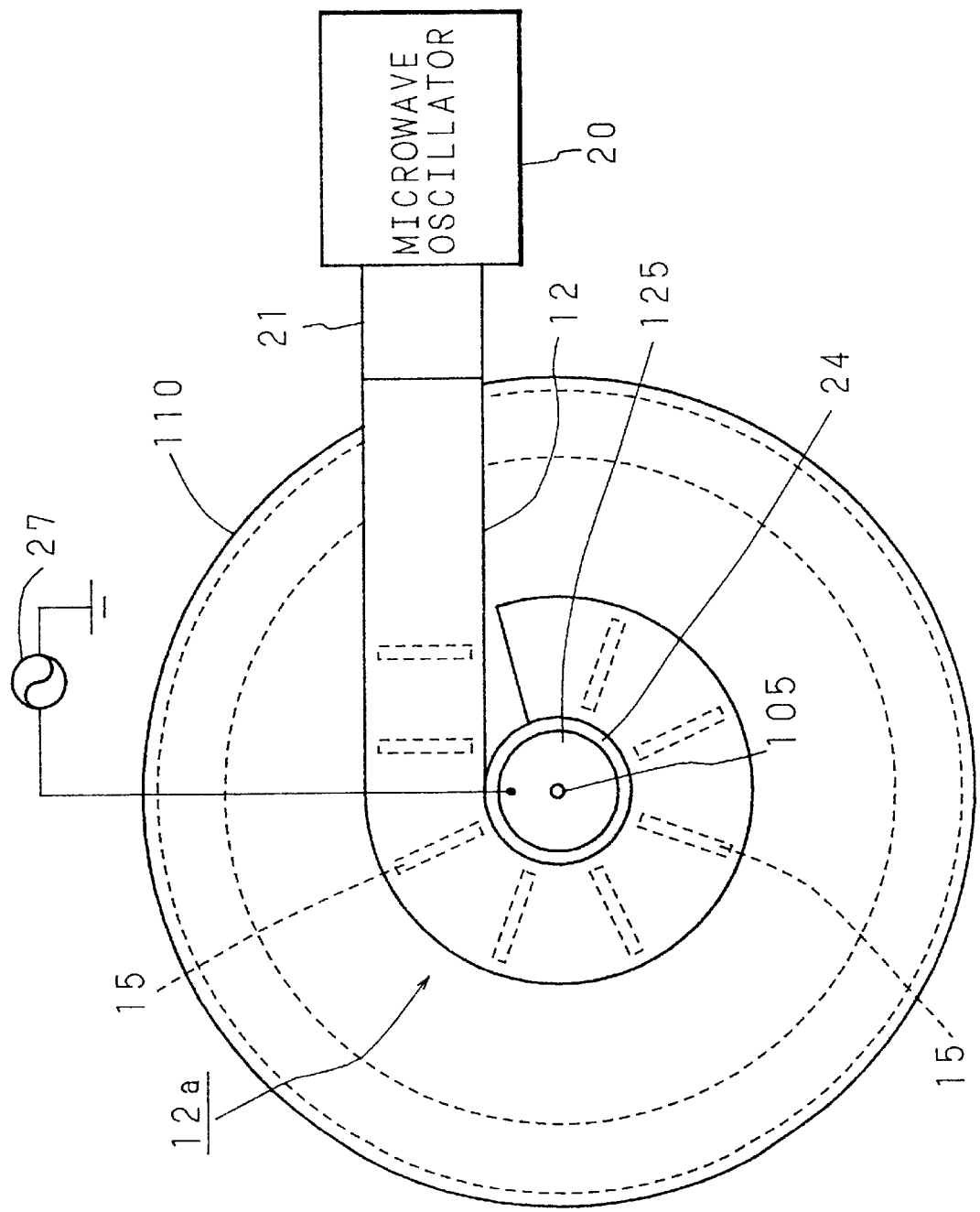
FIG. 19 is a plan view of the microwave plasma process apparatus of FIG. 18.

FIG. 18 is a side sectional view of a microwave plasma process apparatus according to a tenth embodiment, wherein plasma is generated in the process chamber 2 separately from the plasma generated by a microwave emitted from the antenna 11. FIG. 19 is a plan view of the microwave plasma process apparatus of FIG. 18. In FIGS. 18 and 19, like reference numerals are used to refer to like elements shown in FIGS. 16 and 17, and the description is omitted. In a portion of the covering 110 surrounded with the waveguide antenna part 12, a circular hole is formed, and a ring-shaped insulating member 21 is fit in the hole. In the insulating member 24, a disk-shaped electrode 125 having substantially the same thickness as the covering 110 is fit. When the antenna 11 has the aforementioned dimension, the diameter of the electrode 125 is approximately 100 mm.

At the center of the electrode 125, a through hole penetrating the electrode 125 and the sealing plate 104 is formed, and a gas inlet tube 105 is fit in the through hole. The electrode 125 is connected with the second high frequency power supply 27 through a coaxial cable, so that the second high frequency power supply 27 can apply a high frequency of 13.56 MHz to the electrode 125.

In etching the surface of a sample W by using this microwave plasma process apparatus, the pressure in the process chamber 2 is decreased to a desired pressure by exhausting through the air outlet 8, and then, a reaction gas is supplied into the process chamber 2 through the gas inlet tube 105. Subsequently, a microwave of 2.45 GHz is oscillated by the microwave oscillator 20, and the microwave is introduced through the waveguide 21 into the antenna 21, where a standing wave is generated. This standing wave allows an electric field to be emitted from each of the slits of the antenna 11 into the process chamber 2. Thus, plasma is generated in areas respectively corresponding to the slits 15 in the vicinity of the sealing plate 104 within the process chamber 2.

A high frequency of 13.56 MHz is applied to the electrode 125 by the second high frequency power supply 27, thereby generating plasma in an area corresponding to the electrode 125 in the vicinity of the sealing plate 104 within the process chamber 2. The plasma generated in these areas is diffused from the respective areas and propagated to the table 3, and the substantially uniformly diffused plasma etches the surface of the sample W placed on the table 3. In this manner, since the plasma is generated also in the area corresponding to the center of the antenna 11, even when the distance between the table 3 and the sealing plate 104 is small, namely, even when the diffusion distance is small, it is possible to obtain substantially uniform plasma on the same plane as the surface of the table 3. As a result, the entire dimension of the microwave plasma process apparatus can be further decreased, and the plasma process speed can be increased.

Furthermore, the plasma can be generated within the process chamber 2 by applying the high frequency electric field to the electrode 125 in addition to the plasma generated by using the microwave emitted from the antenna 11. Therefore, the plasma process speed at the center and at the edge of the sample can be made uniform by controlling the power of the high frequency electric field applied to the electrode 125 without adjusting the power of the microwave oscillated by the microwave oscillator 20.

Moreover, since the reaction gas is supplied into the process chamber 2 through the gas inlet tube 105 disposed at the center of the electrode 125, the reaction gas is radially diffused toward the entire periphery from substantially the center of the process chamber 2. Accordingly, the plasma is generated in substantially the uniform density in the entire process chamber 2, resulting in treating the sample W at a uniform speed. Furthermore, most of the reaction gas is supplied to the plasma generated in the process chamber 2, and the supplied reaction gas can remain in the plasma for a comparatively long period of time. Accordingly, the usage efficiency of the reaction gas is high. On the other hand, since the gas inlet tube 105 is disposed in the electrode 125 surrounded with the waveguide antenna part 12, the gas inlet tube 105 does not harmfully affect the microwave propagated through the waveguide antenna part 12.

Figure 20:
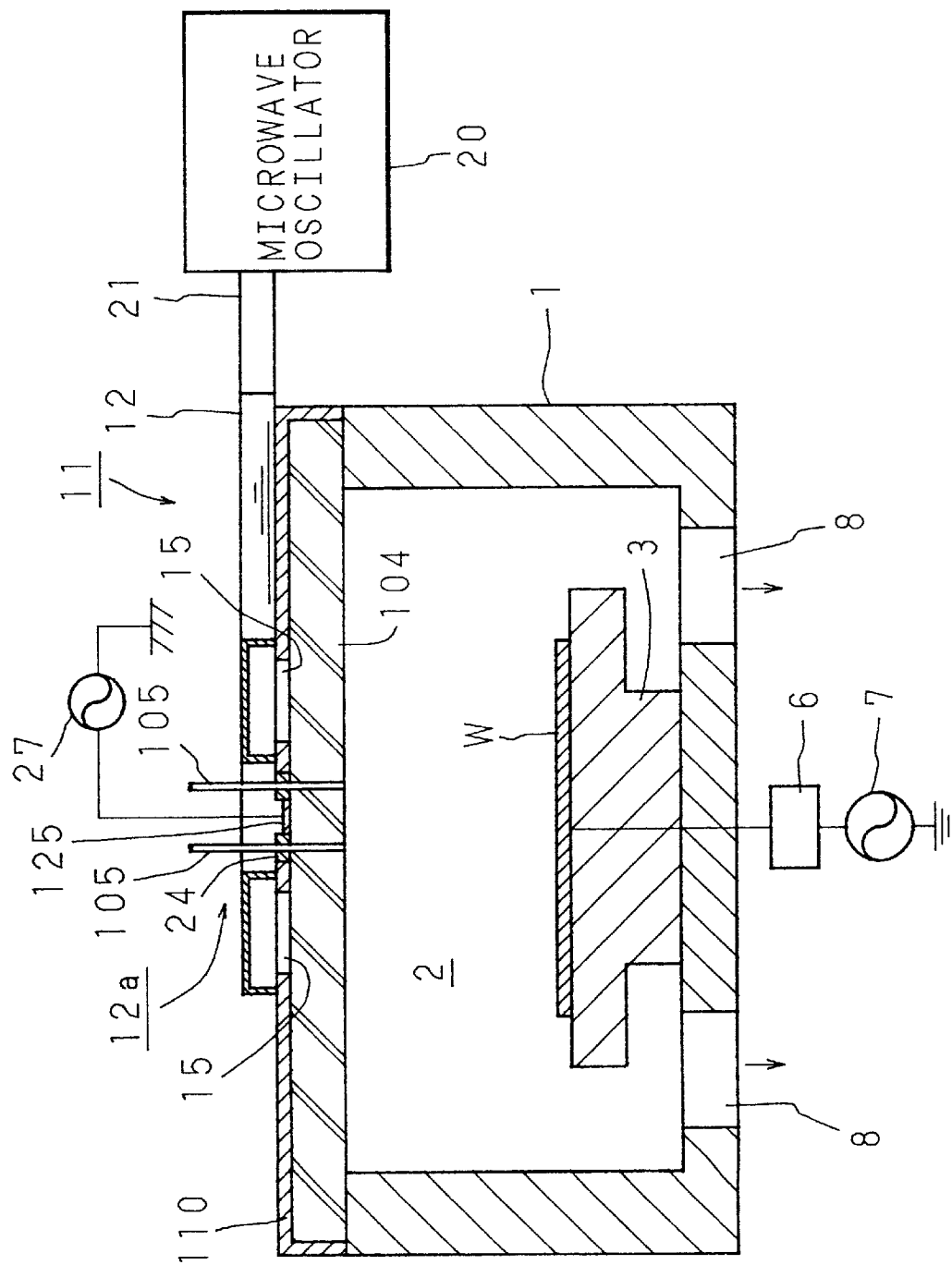
FIG. 20 is a side sectional view for showing another structure of the microwave plasma process apparatus of the tenth embodiment.

In this embodiment, the gas inlet tube 105 is disposed on the electrode 125, which does not limit the invention. The gas inlet tube can be fit in one or more through holes formed in the insulating member 24 so as to penetrate the insulating member 24 and the sealing plate 104 as is shown in FIG. 20. Alternatively, the gas inlet tube can be provided on both the electrode 125 and the insulating member 24. When the insulating member 24 is provided with plural gas inlet tubes, the gas inlet tubes are symmetrically disposed around the center axis of the insulating member 24. In this manner, a reaction gas can be more uniformly introduced into the entire process chamber 2.

In this embodiment, the ring-shaped insulating member 24 is used, which does not limit the invention. Alternatively, a predetermined distance can be provided between the waveguide antenna part 12 and the electrode 125.

Embodiment 11

Figure 21:
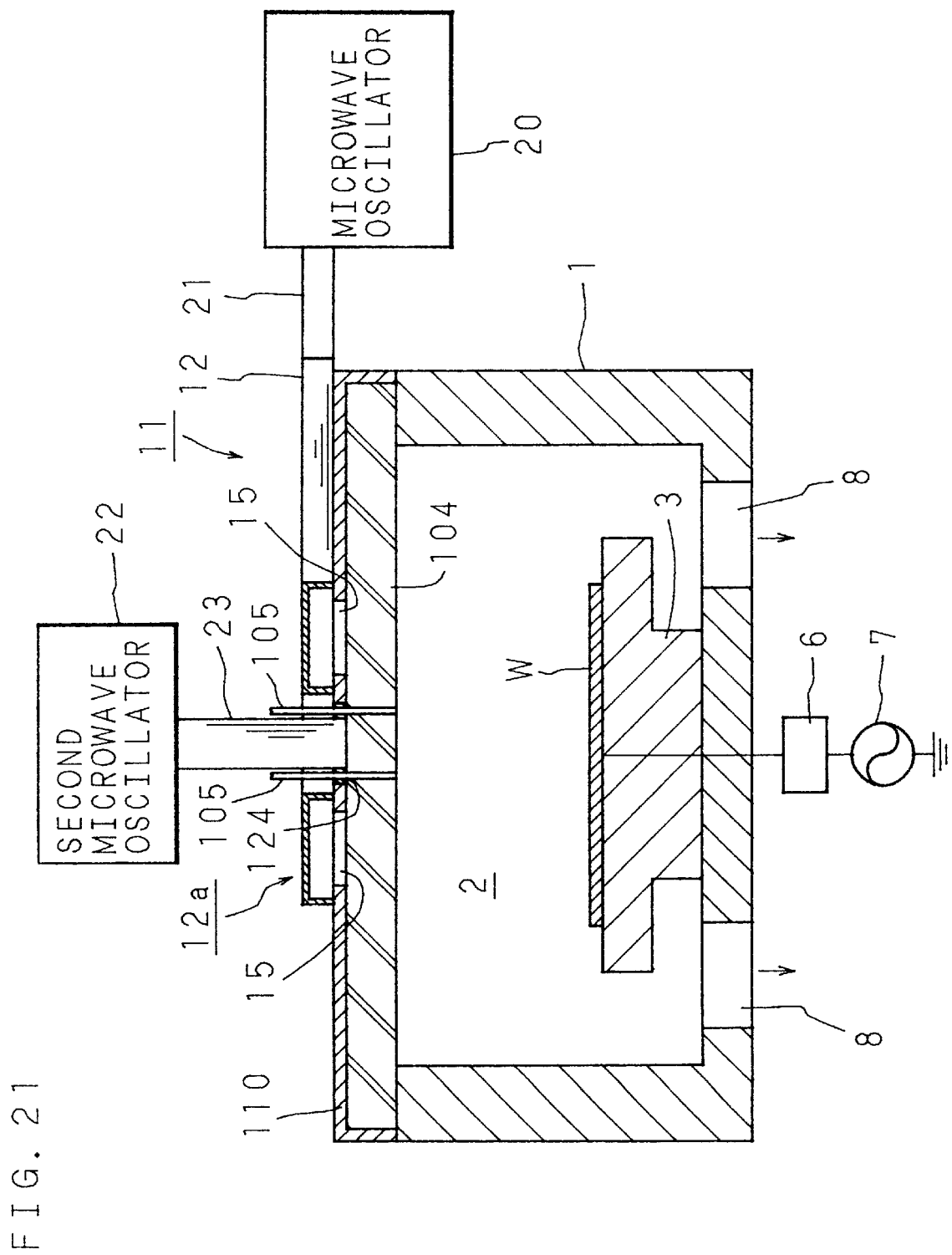
FIG. 21 is a side sectional view for showing the structure of a microwave plasma process apparatus according to an eleventh embodiment of the invention.

FIG. 21 is a side sectional view of a microwave plasma process apparatus according to an eleventh embodiment, wherein the second high frequency power supply 27 of FIG. 18 is replaced with a second microwave oscillator 22. In FIG. 21, like reference numerals are used to refer to like elements shown in FIG. 18, and the description is omitted. As is shown in FIG. 21, in a circular hole formed at the center of the covering 110, one end of a second waveguide 23 in a cylindrical shape is fit with a ring-shaped insulating member 124 sandwiched therebetween. The other end of the second waveguide 23 is connected with the second microwave oscillator 22 for oscillating a microwave of 2.45 GHz. Also, the insulating member 124 is provided with plural through holes penetrating the insulating member 124 and the sealing plate 104 with a predetermined pitch therebetween, and a gas inlet tube 105 is fit in each of the through holes.

In this microwave plasma process apparatus, the microwave of 2.45 GHz is oscillated by the microwave oscillator 20, and the microwave is introduced through the waveguide 21 into the antenna 11, so that an electric field can be emitted into the process chamber 2 from each of the slits 15 of the antenna 11 in the same manner as described above. Thus, plasma is generated in areas respectively corresponding to the slits 15 in the vicinity of the sealing plate 104 within the process chamber 2. Also, a microwave of 2.45 GHz is oscillated by the second microwave oscillator 22, and the microwave is introduced to the center of the sealing plate 104 by the second waveguide 23 and further introduced into the process chamber 2 from the center. Thus, plasma is generated in an area corresponding to the opening of the second waveguide 23 in the vicinity of the sealing plate 104 within the process chamber 2. In this manner, even when the distance between the table 3 and the sealing plate 104 is small, it is possible to obtain substantially uniform plasma on the same plane as the surface of the table 3.

Furthermore, the plasma can be generated within the process chamber 2 by the microwave oscillated by the second microwave oscillator 22 and introduced into the process chamber 2 by the second waveguide 23 in addition to the plasma generated by using the microwave oscillated by the microwave oscillator 20 and emitted from the antenna 11. Therefore, the plasma process speed at the center and at the edge of the sample can be made uniform by controlling the power of the microwave oscillated by the second microwave oscillator 22 without adjusting the power of the microwave oscillated by the microwave oscillator 20.

Moreover, since the reaction gas is supplied into the process chamber 2 through the gas inlet tubes 105 disposed in the insulating member 124 fit around the second waveguide 23 connected at substantially the center of the covering 110, the reaction gas is radially diffused toward the entire periphery from substantially the center of the process chamber 2. Accordingly, the plasma can be generated in substantially the uniform density in the entire process chamber 2, and the usage efficiency of the reaction gas can be improved.

In this embodiment, the insulating member 124 is provided with the plural gas inlet tubes 105, which does not limit the invention. The insulating member 124 can be provided with only one gas inlet tube 105. Also, when the insulating member 124 is provided with plural gas inlet tubes 105, the gas inlet tubes are symmetrically disposed around the center axis of the insulating member 124. In this manner, the reaction gas can be introduced into the entire process chamber more uniformly.

Embodiment 12

Figure 22:
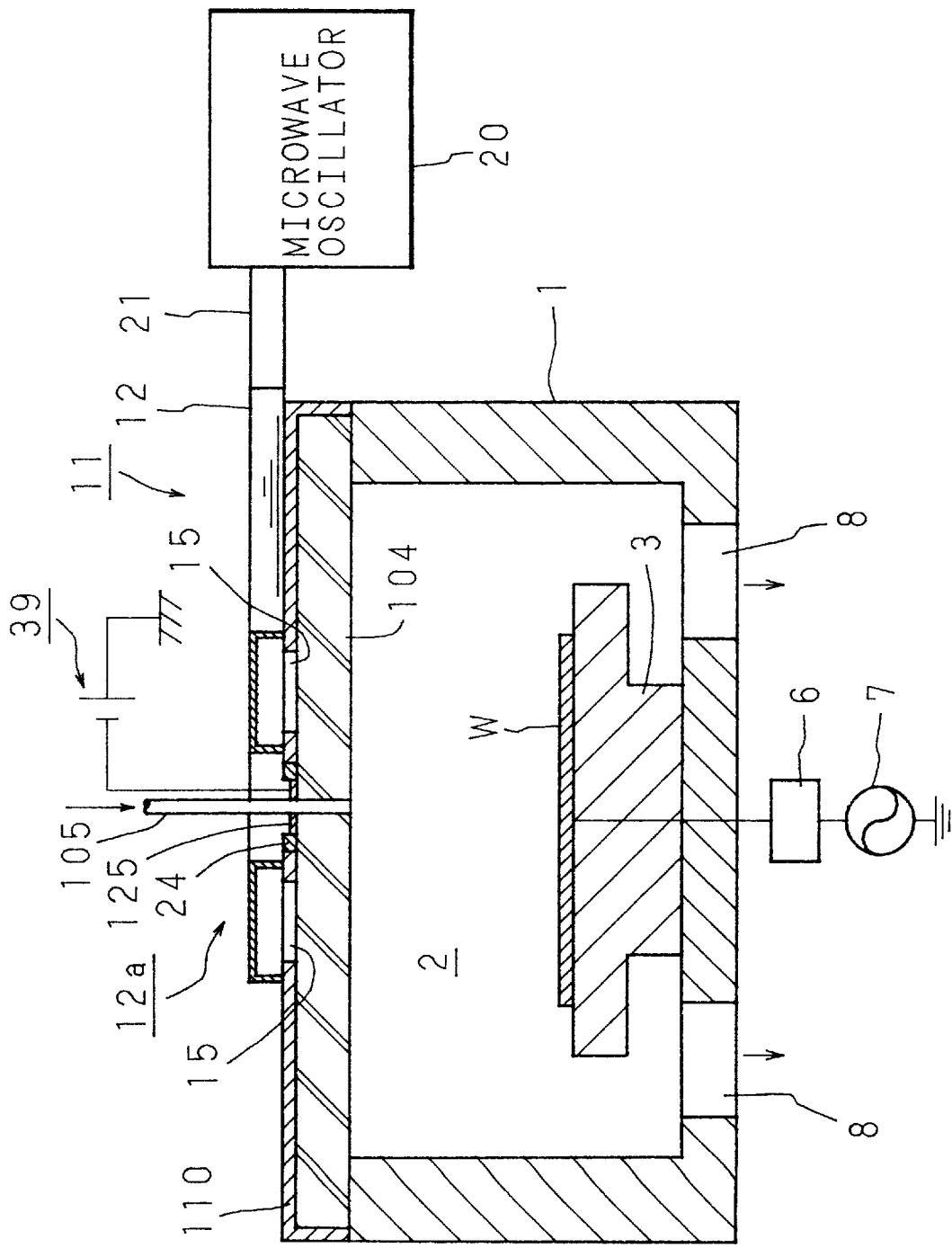
FIG. 22 is a side sectional view for showing the structure of a microwave plasma process apparatus according to a twelfth embodiment of the invention.

FIG. 22 is a side sectional view of a microwave plasma process apparatus according to a twelfth embodiment, wherein the high frequency power supply 27 of FIG. 18 is replaced with a DC power supply 39 for applying a DC voltage to an electrode 125. In FIG. 22, like reference numerals are used to refer to like elements shown in FIG. 18, and the description is omitted. As is shown in FIG. 22, the electrode 125 is connected with the negative terminal of the DC power supply 39, so that a predetermined negative voltage can be applied to the electrode 125 by the DC power supply 39.

In this microwave plasma process apparatus, a microwave of 2.45 GHz is oscillated by the microwave oscillator 20, and the microwave is introduced through the waveguide 21 into the antenna 11, so that an electric field can be emitted into the process chamber 2 from each of the slits 15 of the antenna 11 in the same manner as described above. Thus, plasma is generated in areas respectively corresponding to the slits 15 in the vicinity of the sealing plate 104 within the process chamber 2. Also, the negative voltage is applied to the electrode 125 by the DC power supply 39 for a predetermined period of time, thereby moving positive ions included in the plasma generated in the aforementioned manner toward the center axis of the process chamber 2. In this manner, even when the distance between the table 3 and the sealing plate 104 is small, it is possible to obtain substantially uniform plasma on the same plane as the surface of the table 3.

Furthermore, since the reaction gas is introduced into the process chamber 2 through the gas inlet tube 105 disposed at the center of the electrode 125, the reaction gas can be radially diffused from the center of the process chamber 2 toward the periphery. Therefore, the plasma can be generated in substantially the uniform density in the entire process chamber 2, and the usage efficiency of the reaction gas can be improved.

Embodiment 13

Figure 23:
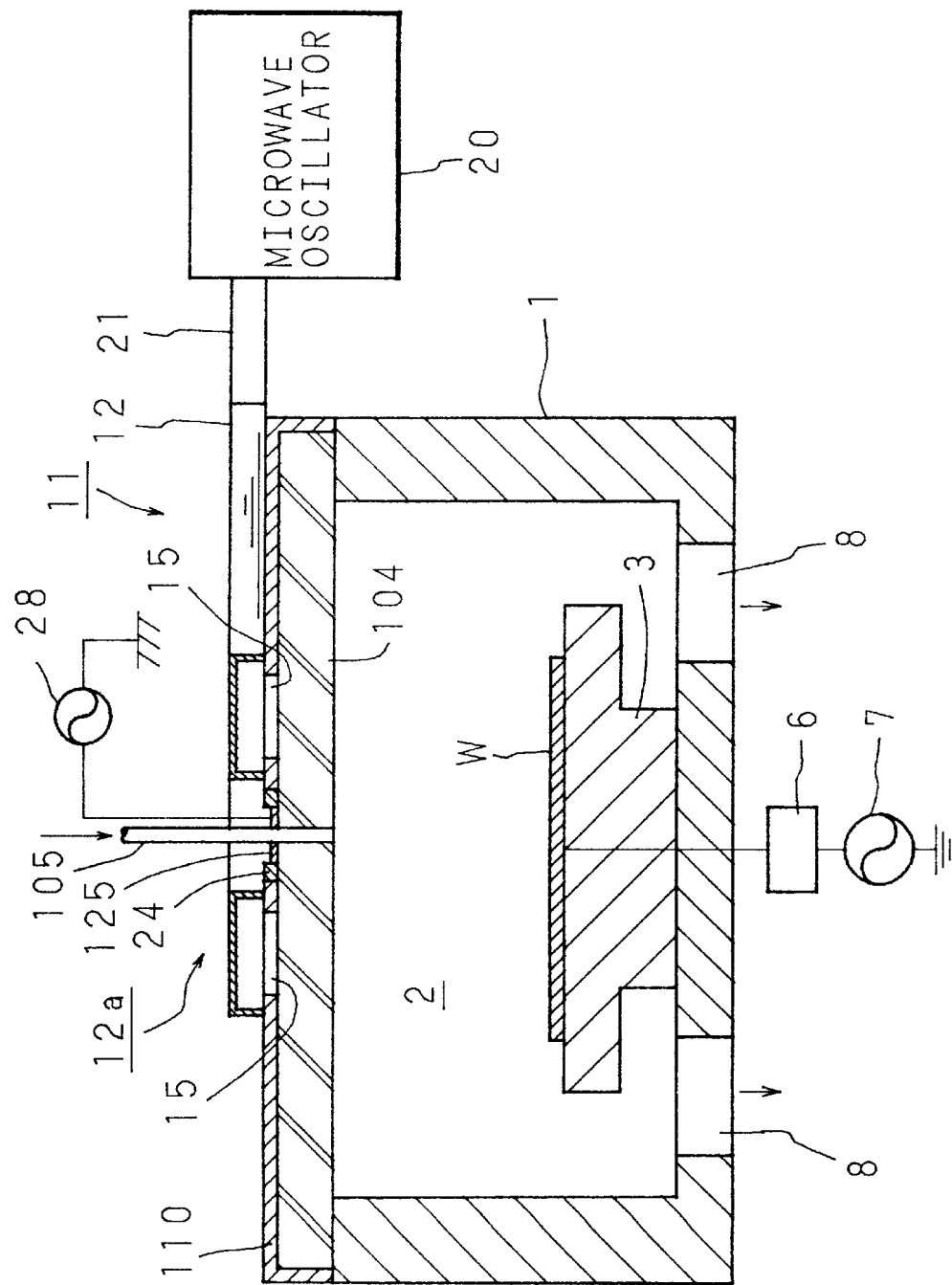
FIG. 23 is a side sectional view for showing the structure of a microwave plasma process apparatus according to a thirteenth embodiment of the invention.

FIG. 23 is a side sectional view of a microwave plasma process apparatus according to a thirteenth embodiment, wherein the second high frequency power supply 27 of FIG. 18 is replaced with a low frequency power supply 28 for applying a low frequency of 400 KHz to the electrode 125. In FIG. 23, like reference numerals are used to refer to like elements shown in FIG. 18, and the description is omitted. As is shown in FIG. 23, the electrode 125 is connected with the output terminal of the low frequency power supply 37, so that a low frequency of 400 KHz can be applied to the electrode 125 by the low frequency power supply 37.

In this microwave plasma process apparatus, a microwave of 2.45 GHz is oscillated by the microwave oscillator 20, and the microwave is introduced through the waveguide 23 into the antenna 11, so that an electric field can be emitted into the process chamber 2 from each of the slits 15 of the antenna 11 in the same manner as described above. Thus, plasma is generated in areas respectively corresponding to the slits in the vicinity of the sealing plate 104 within the process chamber 2. Also, a low frequency of 400 KHz is applied to the electrode 125 by the low frequency power supply 37. When the field of such a low frequency is applied, positive ions included in the plasma generated in the process chamber 2 are moved toward the center of the process chamber 2 when the field is negative and moved in the reverse direction when the field is positive. Accordingly, the diffusion efficiency of the plasma can be improved while stably retaining the state of the generated plasma. In this manner, even when the distance between the table 3 and the sealing plate 104 is small, it is possible to obtain substantially uniform plasma on the same plane as the surface of the table 3.

Furthermore, since the reaction gas is introduced into the process chamber 2 through the gas inlet tube 105 disposed at the center of the electrode 125, the reaction gas can be radially diffused from the center of the process chamber 2 toward the periphery. Therefore, the plasma can be generated in substantially the uniform density in the entire process chamber 2, and the usage efficiency of the reaction gas can be improved.

In this embodiment, the low frequency power supply 37 applies the low frequency of 400 KHz to the electrode 125, but the frequency is not limited to 400 KHz but can be 200 KHz to 2 MHz.

In each of the aforementioned first through thirteenth embodiments, each slit is hollow, which does not limit the invention, and a dielectric can be fit in each slit. When the microwave introduced into the antenna has high power, the electric field of the microwave can be locally collected at the corner of the slit, and there is a possibility of abnormal discharge caused between the slit and the sealing plate. This abnormal discharge can make the generated plasma unstable and uniform, and the plasma process can be spoiled, or the slit or the sealing plate can be damaged. However, when a dielectric is fit in the slit, it is possible to prevent the electric field from collecting at the corner of the slit, and a space where the abnormal discharge can be caused can be covered with the dielectric. Accordingly, the abnormal discharge can be avoided and the sample can be treated with plasma stably and uniformly by using the microwave with more higher power. As the dielectric fit in the slit, Teflon (registered tradename), quartz, alumina or the like that do not absorb a microwave can be used, among which alumina is preferred because it can prevent the electric field from locally collecting.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and hounds of the claims, or equivalence of such metes and bounds thereof are therefore intended to be embraced by the claims.

What is claimed is:

1. A microwave plasma process apparatus, comprising:
   a chamber being sealed with a sealing member;
   a gas inlet tube for introducing a gas into the chamber; and
   an antenna disposed opposing a surface of the sealing member,
   wherein the antenna includes:
   a tubular member having, at one end thereof, an entrance through which a microwave enters and a closing member for closing the other end thereof; and
   a slit formed in a portion of the tubular member opposing the sealing member.

2. The microwave plasma process apparatus according to claim 1, wherein the tubular member is curved, disposing substantially parallel to the surface of the sealing member.

3. The microwave plasma process apparatus according to claim 1, wherein the tubular member is in a C shape or a spiral shape.

4. The microwave plasma process apparatus according to claim 1, wherein the slit is plural in number each of which is away from the closing member by a predetermined distance L.

5. The microwave plasma process apparatus according to claim 4, wherein the predetermined distance L is defined on the basis of the following formula:

$L=\lambda g/2$, wherein $\lambda g$ indicates a wavelength of a microwave propagated through the antenna.

6. The microwave plasma process apparatus according to claim 1, wherein the slit is formed with a longitudinal direction thereof aligned along a direction crossing a center axis of the tubular member.

7. The microwave plasma process apparatus according to claim 1, wherein the slit is formed with a longitudinal direction thereof aligned substantially parallel to a center axis of the tubular member.

8. The microwave plasma process apparatus according to claim 1, wherein a dielectric is fit in the slit.

9. The microwave plasma process apparatus according to claim 1, wherein a dielectric is fit in the tubular member.

10. The microwave plasma process apparatus according to claim 1, wherein the closing member is fit in the tubular member movably in a longitudinal direction of the tubular member.

11. The microwave plasma process apparatus according to claim 1, further comprising:
    a supporting member for supporting the antenna; and
    a driver for moving bi-directionally the supporting member so as to adjust a distance between the antenna and the sealing member.

12. The microwave plasma process apparatus according to claim 2, further comprising:
an electrode disposed in an area on the sealing member surrounded with a curve portion of the antenna and electrically insulated from the antenna.

13. The microwave plasma process apparatus according to claim 12, further comprising a high frequency AC power supply for applying an electric field to the electrode.

14. The microwave plasma process apparatus according to claim 12, further comprising a low frequency AC power supply for applying an electric field to the electrode.

15. The microwave plasma process apparatus according to claim 12, further comprising a DC power supply for applying an electric field to the electrode.

16. The microwave plasma process apparatus according to claim 2, further comprising:
a waveguide connected with an area on the sealing member surrounded with a curve portion of the antenna; and
a microwave oscillator for oscillating a microwave into the waveguide.

17. The microwave plasma process apparatus according to claim 2, further comprising a gas inlet for introducing the gas having passed through the gas inlet tube into the chamber, disposed on a face of the sealing member facing the chamber and in a portion opposing an area surrounded with a curve portion of the antenna.

18. The microwave plasma process apparatus according to claim 17, further comprising an electrode disposed in the area on the sealing member surrounded with the curve portion of the antenna and electrically insulated from the antenna,
wherein the gas inlet tube penetrates the electrode and the sealing member.

19. The microwave plasma process apparatus according to claim 17, further comprising an electrode disposed in the area on the sealing member surrounded with the curve portion of the antenna and electrically insulated from the antenna,
wherein the gas inlet tube penetrates a part of the sealing member opposing a gap between the electrode and an inner circumference of the curve portion of the antenna.

20. The microwave plasma process apparatus according to claim 17, further comprising:
a waveguide connected with the area on the sealing member surrounded with the curve portion of the antenna; and
a microwave oscillator for oscillating a microwave into the waveguide,
wherein the gas inlet tube penetrates a part of the sealing member opposing a gap between the waveguide and an inner circumference of the curve portion of the antenna.

21. A microwave plasma process method of treating a target with plasma generated by using an introduced microwave, comprising the steps of:
introducing a microwave into an antenna of a plasma process apparatus; and
introducing a gas into a chamber through a gas inlet tube of the plasma process apparatus,
wherein the plasma process apparatus includes:
the chamber being sealed with a sealing member;
the gas inlet tube for introducing a gas into the chamber; and
the antenna disposed opposing a surface of the sealing member, the antenna including a tubular member having, at one end thereof, an entrance through which a microwave enters and a closing member for closing the other end thereof; and a slit formed in a portion of the tubular member opposing the sealing member.

22. The microwave plasma process method according to claim 21, wherein the tubular member is curved, disposing substantially parallel to the surface of the sealing member.

23. The microwave plasma process method according to claim 21, further comprising the step of, after introducing the microwave and the gas into the chamber, moving the closing member in a longitudinal direction of the tubular member in accordance with a density of generated plasma,
wherein the plasma process apparatus includes the closing member fit in the tubular member movably along the longitudinal direction of the tubular member.

24. The microwave plasma process method according to claim 21, further comprising the step of, after introducing the microwave and the gas into the chamber, driving a supporting member to move in a direction toward or away from the sealing member in accordance with generated plasma,
wherein the plasma process apparatus further includes the supporting member for supporting the antenna; and a driver for moving bi-directionally the supporting member for adjusting a distance between the antenna and the sealing member.

25. The microwave plasma process method according to claim 21, further comprising the step of applying a voltage to an electrode,
wherein the plasma process apparatus further includes the electrode disposed in an area on the sealing member surrounded with a curve portion of the antenna and electrically separated from the antenna.

26. The microwave plasma process method according to claim 21, further comprising the step of oscillating a microwave into a waveguide,
wherein the plasma process apparatus further includes the waveguide connected with an area on the sealing member surrounded with a curve portion of the antenna; and a microwave oscillator for oscillating a microwave into the waveguide.

27. The microwave plasma process method according to claim 21,
wherein the plasma process apparatus includes a gas inlet disposed on an inner face of the sealing member facing the chamber and in a portion opposing an area surrounded with a curve portion of the antenna for introducing the gas having passed through the gas inlet tube into the chamber.

* * * * *